US012724089B2

(12) United States Patent
Hu et al.

(10) Patent No.: US 12,724,089 B2
(45) Date of Patent: Sep. 1, 2026

(54) PHOTOVOLTAIC INVERTER AND LEAKAGE CURRENT DETECTION APPARATUS

(71) Applicant: Huawei Digital Power Technologies Co., Ltd., Shenzhen (CN)

(72) Inventors: Tianqi Hu, Xi'an (CN); Hui Shi, Xi'an (CN); Libin Hui, Xi'an (CN); Chengfei Sun, Xi'an (CN); Yufang Xiao, Xi'an (CN)

(73) Assignee: HUAWEI DIGITAL POWER TECHNOLOGIES CO., LTD., Shenzhen (CN)

( * ) Notice: Subject to any disclaimer, the term of this patent is extended or adjusted under 35 U.S.C. 154(b) by 178 days.

(21) Appl. No.: 18/747,832

(22) Filed: Jun. 19, 2024

(65) Prior Publication Data

US 2024/0339914 A1 Oct. 10, 2024

Related U.S. Application Data

(63) Continuation of application No. PCT/CN2024/071988, filed on Jan. 12, 2024.

(30) Foreign Application Priority Data

Feb. 2, 2023 (CN) ......................... 202310120732.3

(51) Int. Cl.
*G01R 31/52* (2020.01)
*G01R 15/18* (2006.01)
(Continued)

(52) U.S. Cl.
CPC ........... *G01R 31/52* (2020.01); *G01R 15/183* (2013.01); *H02M 1/0009* (2021.05); *H02M 7/44* (2013.01)

(58) Field of Classification Search
CPC ... G01R 15/183; G01R 31/52; H02M 1/0009; H02M 7/44
See application file for complete search history.

(56) References Cited

U.S. PATENT DOCUMENTS

| | | | | |
|---|---|---|---|---|
| 9,680,394 | B2 * | 6/2017 | Yu | H02M 7/219 |
| 11,366,177 | B1 * | 6/2022 | Chang | G01R 1/44 |

(Continued)

FOREIGN PATENT DOCUMENTS

| | | | |
|---|---|---|---|
| CN | 102680851 | A | 9/2012 |
| CN | 103424643 | A | 12/2013 |

(Continued)

OTHER PUBLICATIONS

He Mingjing et al: "Study on Residual Current Protector for Electric Vehicle Charging Pile", 2021 IEEE 1st International Power Electronics and Application Symposium (PEAS), IEEE, Nov. 13, 2021, XP034040290, 5 pages.

*Primary Examiner* — Gary L Laxton
(74) *Attorney, Agent, or Firm* — Conley Rose, P.C.

(57) ABSTRACT

A photovoltaic inverter may include a magnetic ring, a leakage current detection winding, a modulation wave circuit, a filter circuit, and a first direct current power supply. The modulation wave circuit includes a first push-pull circuit, a comparator, a second direct current power supply, and a leakage current sampling resistor. The first push-pull circuit includes a first switching transistor and a second switching transistor. The first switching transistor is turned on when the comparator outputs a first level signal. The second switching transistor is turned on when the comparator outputs a second level signal. The comparator outputs a carrier signal. When the leakage current detection winding is in a charging saturation status, a level signal output by the comparator is inverted.

20 Claims, 9 Drawing Sheets

(51) Int. Cl.
*H02M 1/00* (2006.01)
*H02M 7/44* (2006.01)

(56) References Cited

U.S. PATENT DOCUMENTS

| | | | | |
|---|---|---|---|---|
| 2014/0132278 | A1* | 5/2014 | Tang | G01R 31/52 324/509 |
| 2019/0331725 | A1 | 10/2019 | Ikushima et al. | |
| 2020/0220478 | A1* | 7/2020 | Kanai | H02M 7/493 |
| 2023/0020049 | A1* | 1/2023 | Wang | G01R 15/183 |
| 2023/0141539 | A1* | 5/2023 | Lei | G01R 31/42 324/500 |

FOREIGN PATENT DOCUMENTS

| | | | |
|---|---|---|---|
| CN | 109932558 | A | 6/2019 |
| CN | 113552406 | A | 10/2021 |
| CN | 113972624 | A | 1/2022 |
| CN | 116256665 | A | 6/2023 |
| WO | 2015139654 | A1 | 9/2015 |

* cited by examiner

PHOTOVOLTAIC INVERTER AND LEAKAGE CURRENT DETECTION APPARATUS

CROSS-REFERENCE TO RELATED APPLICATION

This is a continuation of International Patent Application No. PCT/CN2024/071988 filed on Jan. 12, 2024, which claims priority to Chinese Patent Application No. 202310120732.3 filed on Feb. 2, 2023. The disclosures of the aforementioned applications are hereby incorporated by reference in their entireties.

TECHNICAL FIELD

This application relates to the field of power supply technologies, and in particular, to a photovoltaic inverter and a leakage current detection apparatus.

BACKGROUND

Currently, a leakage current detection manner is mainly implemented by using a leakage current sensor. The leakage current sensor includes a magnetic ring and a detection winding wound on the magnetic ring. When the leakage current sensor works, a detection apparatus at which the leakage current sensor is located provides an alternating current with a fixed frequency and a fixed waveform to the detection winding for excitation, so that the magnetic ring is magnetized in a reciprocating manner to saturation. When a measured magnetic field generated by an external current does not exist, an induced electromotive force waveform output by the detection winding is symmetric in longitudinal direction for positive and negative half parts. When a leakage current is generated on an alternating current side of a to-be-detected device, both a leakage current magnetic field and an excitation alternating magnetic field exist in the magnetic ring. Due to the leakage current magnetic field, the magnetic ring is saturated in advance in a first half period, and the magnetic ring is delayed to be saturated in the other half period. As a result, the positive and negative half periods in an excitation period are asymmetric, and an amplitude difference occurs in an output voltage curve. The amplitude difference is directly proportional to the magnetic field generated by the detected leakage current. Therefore, the detection apparatus can detect, based on the amplitude difference, a current passing through the magnetic ring.

In the foregoing leakage current detection manner, a current on the detection winding is usually limited by a maximum current value of a charging loop at which the detection winding is located. A maximum current value of the charging loop depends on a current limit value of a circuit element in the charging loop. When the maximum current value of the charging loop at which the detection winding is located is relatively small, a relatively long time is required for the detection winding to enter a charging saturation status, thereby reducing leakage current detection precision of the detection apparatus.

SUMMARY

This application provides a photovoltaic inverter and a leakage current detection apparatus, to improve leakage current detection precision.

According to a first aspect, this application provides a photovoltaic inverter. An input end and an output end of the photovoltaic inverter are respectively configured to connect a photovoltaic string and an alternating current power grid. The photovoltaic inverter includes an inverter circuit, a magnetic ring, a leakage current detection winding, a modulation wave circuit, a filter circuit, and a first direct current power supply. The leakage current detection winding is wound on the magnetic ring. A connection line between an output end of the inverter circuit and the output end of the photovoltaic inverter passes through the magnetic ring. The modulation wave circuit includes a first push-pull circuit, a comparator, a second direct current power supply, and a leakage current sampling resistor. The first push-pull circuit includes a first switching transistor and a second switching transistor. A series connection point of the first switching transistor and the second switching transistor is connected to a first end of the leakage current detection winding. A second end of the leakage current detection winding is connected to the leakage current sampling resistor. A control end of the first switching transistor and a control end of the second switching transistor are connected to an output end of the comparator. The first switching transistor is configured to be in an on state when the comparator outputs a first level signal, to control the first direct current power supply so that the leakage current detection winding is in a first charging state. The second switching transistor is configured to be in an on state when the comparator outputs a second level signal, to control the second direct current power supply so that the leakage current detection winding is in a second charging state. A current direction of the leakage current detection winding in the first charging state is opposite to a current direction of the leakage current detection winding in the second charging state. A positive input terminal and a negative input terminal of the comparator are respectively connected to the first end and the second end of the leakage current detection winding. The output end of the comparator is connected to an output end of the first direct current power supply, and is configured to output a carrier signal. The carrier signal includes the first level signal and the second level signal that are alternating. When the leakage current detection winding is in a charging saturation status, a level signal output by the comparator is inverted. Input ends of the filter circuit are respectively connected to two ends of the leakage current sampling resistor. The filter circuit is configured to filter a voltage signal at the two ends of the leakage current sampling resistor based on the carrier signal, to obtain a leakage voltage signal.

It may be understood that in the photovoltaic inverter, the first switching transistor and the first direct current power supply form a charging loop of the leakage current detection winding in the first charging state, and the second switching transistor and the second direct current power supply form a charging loop of the leakage current detection winding in the second charging state. In addition, because a value of a load current that can pass through each switching transistor in the push-pull circuit is large, a current value of the leakage current detection winding in a charging status increases. Therefore, duration required for the leakage current detection winding to enter the charging saturation status is shortened, thereby improving detection precision of leakage current detection of the photovoltaic inverter.

With reference to the first aspect, in a first possible implementation, a first end and a second end of the first switching transistor are respectively connected to the output end of the first direct current power supply and a first end of the second switching transistor. A second end of the second switching transistor is connected to a reference ground. It may be understood that, by using the push-pull circuit of an upper N-lower P structure, the modulation wave circuit can increase the current value of the charging loop at which the leakage current detection winding is located. Therefore, duration required for the leakage current detection winding to enter the charging saturation status is shortened, thereby improving detection precision of leakage current detection of the photovoltaic inverter.

With reference to the first aspect or the first possible implementation of the first aspect, in a second possible implementation, the modulation wave circuit further includes a first resistor, a second resistor, and a third resistor. The positive input terminal of the comparator is connected to an output end of the second direct current power supply through the first resistor. The positive input terminal of the comparator is connected to the first end of the leakage current detection winding through the second resistor. The negative input terminal of the comparator is connected to the second end of the leakage current detection winding and one end of the leakage current sampling resistor through the third resistor. The other end of a leakage current sampling resistor is connected to the output end of the second direct current power supply. It may be understood that input current limiting resistors of the comparator, to be specific, the second resistor and the third resistor, are added to the modulation wave circuit, so that a case in which the level signal output by the comparator is incorrectly inverted due to oscillation of an input signal of the comparator can be effectively avoided. Therefore, accuracy of the carrier signal output by the comparator is improved, thereby improving detection precision and accuracy of leakage current detection of the photovoltaic inverter.

With reference to the second possible implementation of the first aspect, in a third possible implementation, the modulation wave circuit further includes a first diode, a second diode, a third diode, and a fourth diode. A cathode of the first diode and a cathode of the third diode are connected to the output end of the first direct current power supply. An anode of the first diode is connected to a cathode of the second diode and the first end of the leakage current detection winding. An anode of the third diode is connected to a cathode of the fourth diode and the second end of the leakage current detection winding. An anode of the second diode and an anode of the fourth diode are connected to the reference ground. It may be understood that four diodes from the first diode to the fourth diode are added to the modulation wave circuit, so that not only voltages at two ends of the leakage current detection winding can be clamped, but also each switching transistor in the first push-pull circuit can be protected. Therefore, stability of the modulation wave circuit during working is improved, thereby improving stability of the photovoltaic inverter during working.

With reference to any one of the first aspect to the third possible implementation of the first aspect, in a fourth possible implementation, the modulation wave circuit further includes a fourth resistor. The fourth resistor is connected between the positive input terminal and the output end of the comparator, so that the fourth resistor and the comparator form a hysteresis comparator, to avoid a case in which a frequency of the carrier signal is abnormal because of a plurality of times of output inversion when a voltage at the positive input terminal of the comparator is close to a voltage at the negative input terminal. Therefore, stability of the carrier signal output by the comparator is improved, thereby improving detection precision and accuracy of leakage current detection of the photovoltaic inverter.

With reference to any one of the first aspect to the fourth possible implementation of the first aspect, in a fifth possible implementation, the modulation wave circuit further includes a fifth resistor and a sixth resistor. The output end of the comparator is connected to the control end of the first switching transistor through the fifth resistor. The output end of the comparator is connected to the control end of the second switching transistor through the sixth resistor. It may be understood that base resistors of the switching transistors in the first push-pull circuit, to be specific, the fifth resistor and the sixth resistor, are added to the modulation wave circuit, to limit base currents of the switching transistors and protect the switching transistors. Therefore, stability of the modulation wave circuit during working is improved, thereby improving detection precision and accuracy of leakage current detection of the photovoltaic inverter.

With reference to any one of the first aspect to the fifth possible implementation of the first aspect, in a sixth possible implementation, the second direct current power supply includes a first operational amplifier, a seventh resistor, and an eighth resistor. A positive input terminal of the first operational amplifier is connected to the output end of the first direct current power supply through the seventh resistor. The positive input terminal of the first operational amplifier is connected to the reference ground through the eighth resistor. An output end of the first operational amplifier is connected to a negative input terminal of the first operational amplifier and the output end of the second direct current power supply. It may be understood that the second direct current power supply in this implementation is a voltage follower. A circuit structure is simple and easy to control, thereby improving efficiency of leakage current detection of the photovoltaic inverter.

With reference to any one of the first aspect to the fifth possible implementation of the first aspect, in a seventh possible implementation, the second direct current power supply includes a first operational amplifier, a seventh resistor, an eighth resistor, and a second push-pull circuit. The second push-pull circuit includes a third switching transistor and a fourth switching transistor. A positive input terminal of the first operational amplifier is connected to the output end of the first direct current power supply through the seventh resistor. The positive input terminal of the first operational amplifier is connected to the reference ground through the eighth resistor. A series connection point of the third switching transistor and the fourth switching transistor is connected to a negative input terminal of the first operational amplifier and the output end of the second direct current power supply. A control end of the third switching transistor and a control end of the fourth switching transistor are connected to an output end of the first operational amplifier. The third switching transistor is configured to be in a linear state when an output voltage of the first operational amplifier is within a preset voltage range. The fourth switching transistor is configured to be in a linear state when the output voltage of the first operational amplifier is within the preset voltage range. The linear state is a transition state between an off state and an on state of a switching transistor. It may be understood that the second push-pull circuit is added to the second direct current power supply, so that a driving capability of the second direct current power supply can be enhanced. Therefore, output stability of the second direct current power supply is improved, thereby improving precision and accuracy of leakage current detection of the photovoltaic inverter.

With reference to the seventh possible implementation of the first aspect, in an eighth possible implementation, a first end and a second end of the third switching transistor are respectively connected to the output end of the first direct current power supply and a first end of the fourth switching transistor. A second end of the fourth switching transistor is connected to the reference ground.

With reference to any one of the sixth possible implementation of the first aspect to the eighth possible implementation of the first aspect, in a ninth possible implementation, an output voltage of the second direct current power supply is greater than or equal to half of an output voltage of the first direct current power supply. It may be understood that a range of the output voltage of the second direct current power supply is large, so that applicability of the second direct current power supply is high.

With reference to any one of the first aspect to the ninth possible implementation of the first aspect, in a tenth possible implementation, input ends of the filter circuit include a first input end and a second input end. The filter circuit includes a second operational amplifier, a third operational amplifier, a ninth resistor, a tenth resistor, an eleventh resistor, a first capacitor, and a second capacitor. The ninth resistor and the first capacitor are connected in series between a positive input terminal and a negative input terminal of the second operational amplifier. The tenth resistor is connected between the negative input terminal and an output end of the second operational amplifier. A positive input terminal of the third operational amplifier is connected to the output end of the second operational amplifier. The eleventh resistor and the second capacitor are connected in parallel between a negative input terminal and an output end of the third operational amplifier. The positive input terminal of the second operational amplifier and the negative input terminal of the third operational amplifier are respectively connected to the first input end and the second input end of the filter circuit. The output end of the third operational amplifier is connected to an output end of the filter circuit. It may be understood that the filter circuit uses a two-stage filter structure, so that gain stability of a filter in a leakage current detection frequency range can be improved. In addition, a signal attenuation speed in a stopband of the filter can be increased, thereby improving detection precision and accuracy of leakage current detection.

With reference to the tenth possible implementation of the first aspect, in an eleventh possible implementation, the filter circuit is configured to filter out, in the voltage signal, a high-frequency signal whose frequency is greater than a cut-off frequency. The cut-off frequency is less than or equal to 2.5 kilohertz (kHz).

According to a second aspect, this application provides a leakage current detection apparatus. The leakage current detection apparatus includes a magnetic ring, a leakage current detection winding, a modulation wave circuit, a filter circuit, and a first direct current power supply. The leakage current detection winding is wound on the magnetic ring. An output end connection line of a to-be-detected device passes through the magnetic ring. The modulation wave circuit includes a first push-pull circuit, a comparator, a second direct current power supply, and a leakage current sampling resistor. The first push-pull circuit includes a first switching transistor and a second switching transistor. A series connection point of the first switching transistor and the second switching transistor is connected to a first end of the leakage current detection winding. A second end of the leakage current detection winding is connected to the leakage current sampling resistor. A control end of the first switching transistor and a control end of the second switching transistor are connected to an output end of the comparator. The first switching transistor is configured to be in an on state when the comparator outputs a first level signal, to control the first direct current power supply so that the leakage current detection winding is in a first charging state. The second switching transistor is configured to be in an on state when the comparator outputs a second level signal, to control the second direct current power supply so that the leakage current detection winding is in a second charging state. A current direction of the leakage current detection winding in the first charging state is opposite to a current direction of the leakage current detection winding in the second charging state. A positive input terminal and a negative input terminal of the comparator are respectively connected to the first end and the second end of the leakage current detection winding. The output end of the comparator is connected to an output end of the first direct current power supply, and is configured to output a carrier signal. The carrier signal includes the first level signal and the second level signal that are alternating. When the leakage current detection winding is in a charging saturation status, a level signal output by the comparator is inverted. Input ends of the filter circuit are respectively connected to two ends of the leakage current sampling resistor. The filter circuit is configured to filter a voltage signal at the two ends of the leakage current sampling resistor based on the carrier signal, to obtain a leakage voltage signal.

It may be understood that in the leakage current detection apparatus, the first switching transistor and the first direct current power supply form a charging loop of the leakage current detection winding in the first charging state, and the second switching transistor and the second direct current power supply form a charging loop of the leakage current detection winding in the second charging state. In addition, because a value of a load current that can pass through each switching transistor in the push-pull circuit is large, a current value of the leakage current detection winding in a charging status increases. Therefore, duration required for the leakage current detection winding to enter the charging saturation status is shortened, thereby improving detection precision of leakage current detection of the leakage current detection apparatus.

With reference to the second aspect, in a first possible implementation, a first end and a second end of the first switching transistor are respectively connected to the output end of the first direct current power supply and a first end of the second switching transistor. A second end of the second switching transistor is connected to a reference ground. It may be understood that, by using the push-pull circuit of an upper N-lower P structure, the modulation wave circuit can increase a current value of a charging loop at which the leakage current detection winding is located. Therefore, duration required for the leakage current detection winding to enter charging saturation is shortened, thereby improving leakage current detection precision of the leakage current detection apparatus.

With reference to the second aspect or the first possible implementation of the second aspect, in a second possible implementation, the modulation wave circuit further includes a first resistor, a second resistor, and a third resistor. The positive input terminal of the comparator is connected to an output end of the second direct current power supply through the first resistor. The positive input terminal of the comparator is connected to the first end of the leakage current detection winding through the second resistor. The negative input terminal of the comparator is connected to the second end of the leakage current detection winding and one end of the leakage current sampling resistor through the third resistor. The other end of a leakage current sampling resistor is connected to the output end of the second direct current power supply. It may be understood that input current limiting resistors of the comparator, to be specific, the second resistor and the third resistor, are added to the modulation wave circuit, so that a case in which the level signal output by the comparator is incorrectly inverted due to oscillation of an input signal of the comparator can be effectively avoided. Therefore, accuracy of the carrier signal output by the comparator is improved, thereby improving detection precision and accuracy of leakage current detection of the leakage current detection apparatus.

With reference to the second possible implementation of the second aspect, in a third possible implementation, the modulation wave circuit further includes a first diode, a second diode, a third diode, and a fourth diode. A cathode of the first diode and a cathode of the third diode are connected to the output end of the first direct current power supply. An anode of the first diode is connected to a cathode of the second diode and the first end of the leakage current detection winding. An anode of the third diode is connected to a cathode of the fourth diode and the second end of the leakage current detection winding. An anode of the second diode and an anode of the fourth diode are connected to the reference ground. It may be understood that four diodes from the first diode to the fourth diode are added to the modulation wave circuit, so that not only voltages at two ends of the leakage current detection winding can be clamped, but also each switching transistor in the first push-pull circuit can be protected. Therefore, stability of the modulation wave circuit during working is improved, thereby improving stability of the leakage current detection apparatus during working.

With reference to any one of the second aspect to the third possible implementation of the second aspect, in a fourth possible implementation, the modulation wave circuit further includes a fourth resistor. The fourth resistor is connected between the positive input terminal and the output end of the comparator, so that the fourth resistor and the comparator form a hysteresis comparator, to avoid a case in which a frequency of the carrier signal is abnormal because of a plurality of times of output inversion when a voltage at the positive input terminal of the comparator is close to a voltage at the negative input terminal. Therefore, stability of the carrier signal output by the comparator is improved, thereby improving detection precision and accuracy of leakage current detection of the leakage current detection apparatus.

With reference to any one of the second aspect to the fourth possible implementation of the second aspect, in a fifth possible implementation, the modulation wave circuit further includes a fifth resistor and a sixth resistor. The output end of the comparator is connected to the control end of the first switching transistor through the fifth resistor. The output end of the comparator is connected to the control end of the second switching transistor through the sixth resistor. It may be understood that base resistors of the switching transistors in the first push-pull circuit, to be specific, the fifth resistor and the sixth resistor, are added to the modulation wave circuit, to limit base currents of the switching transistors and protect the switching transistors. Therefore, stability of the modulation wave circuit during working is improved, thereby improving detection precision and accuracy of leakage current detection of the leakage current detection apparatus.

With reference to any one of the second aspect to the fifth possible implementation of the second aspect, in a sixth possible implementation, the second direct current power supply includes a first operational amplifier, a seventh resistor, and an eighth resistor. A positive input terminal of the first operational amplifier is connected to the output end of the first direct current power supply through the seventh resistor. The positive input terminal of the first operational amplifier is connected to the reference ground through the eighth resistor. An output end of the first operational amplifier is connected to a negative input terminal of the first operational amplifier and the output end of the second direct current power supply. It may be understood that the second direct current power supply in this implementation is a voltage follower. A circuit structure is simple and easy to control, thereby improving efficiency of leakage current detection of the leakage current detection apparatus.

With reference to any one of the second aspect to the fifth possible implementation of the second aspect, in a seventh possible implementation, the second direct current power supply includes a first operational amplifier, a seventh resistor, an eighth resistor, and a second push-pull circuit. The second push-pull circuit includes a third switching transistor and a fourth switching transistor. A positive input terminal of the first operational amplifier is connected to the output end of the first direct current power supply through the seventh resistor. The positive input terminal of the first operational amplifier is connected to the reference ground through the eighth resistor. A series connection point of the third switching transistor and the fourth switching transistor is connected to a negative input terminal of the first operational amplifier and the output end of the second direct current power supply. A control end of the third switching transistor and a control end of the fourth switching transistor are connected to an output end of the first operational amplifier. The third switching transistor is configured to be in a linear state when an output voltage of the first operational amplifier is within a preset voltage range. The fourth switching transistor is configured to be in a linear state when the output voltage of the first operational amplifier is within the preset voltage range. The linear state is a transition state between an off state and an on state of a switching transistor. It may be understood that the second push-pull circuit is added to the second direct current power supply, so that a driving capability of the second direct current power supply can be enhanced. Therefore, output stability of the second direct current power supply is improved, thereby improving precision and accuracy of leakage current detection of the leakage current detection apparatus.

With reference to the seventh possible implementation of the second aspect, in an eighth possible implementation, a first end and a second end of the third switching transistor are respectively connected to the output end of the first direct current power supply and a first end of the fourth switching transistor. A second end of the fourth switching transistor is connected to the reference ground.

With reference to any one of the sixth possible implementation of the second aspect to the eighth possible implementation of the second aspect, in a ninth possible implementation, an output voltage of the second direct current power supply is greater than or equal to half of an output voltage of the first direct current power supply. It may be understood that a range of the output voltage of the second direct current power supply is large, so that applicability of the second direct current power supply is high.

With reference to any one of the second aspect to the ninth possible implementation of the second aspect, in a tenth possible implementation, input ends of the filter circuit include a first input end and a second input end. The filter circuit includes a second operational amplifier, a third operational amplifier, a ninth resistor, a tenth resistor, an eleventh resistor, a first capacitor, and a second capacitor. The ninth resistor and the first capacitor are connected in series between a positive input terminal and a negative input terminal of the second operational amplifier. The tenth resistor is connected between the negative input terminal and an output end of the second operational amplifier. A positive input terminal of the third operational amplifier is connected to the output end of the second operational amplifier. The eleventh resistor and the second capacitor are connected in parallel between a negative input terminal and an output end of the third operational amplifier. The positive input terminal of the second operational amplifier and the negative input terminal of the third operational amplifier are respectively connected to the first input end and the second input end of the filter circuit. The output end of the third operational amplifier is connected to an output end of the filter circuit. It may be understood that the filter circuit uses a two-stage filter structure, so that gain stability of a filter in a leakage current detection frequency range can be improved. In addition, a signal attenuation speed in a stopband of the filter can be increased, thereby improving detection precision and accuracy of the leakage current detection apparatus.

With reference to the tenth possible implementation of the second aspect, in an eleventh possible implementation, the filter circuit is configured to filter out, in the voltage signal, a high-frequency signal whose frequency is greater than a cut-off frequency. The cut-off frequency is less than or equal to 2.5 kHz.

DESCRIPTION OF EMBODIMENTS

A leakage current detection apparatus and a photovoltaic inverter provided in this application may be applied to a plurality of application fields such as a photovoltaic power generation field, a wind power generation field, a new energy smart microgrid field, and a power transmission and distribution field. The leakage current detection apparatus provided in this application is applicable to a device that may need to detect a leakage current on an alternating current side, such as a photovoltaic inverter and an uninterruptible power supply (UPS). The leakage circuit detection apparatus and the photovoltaic inverter provided in this application may be applied to different application scenarios, for example, a photovoltaic power supply scenario, an energy storage power supply scenario, and a UPS power supply scenario. The following describes the photovoltaic inverter by using the photovoltaic power supply scenario as an example.

Figure 1:
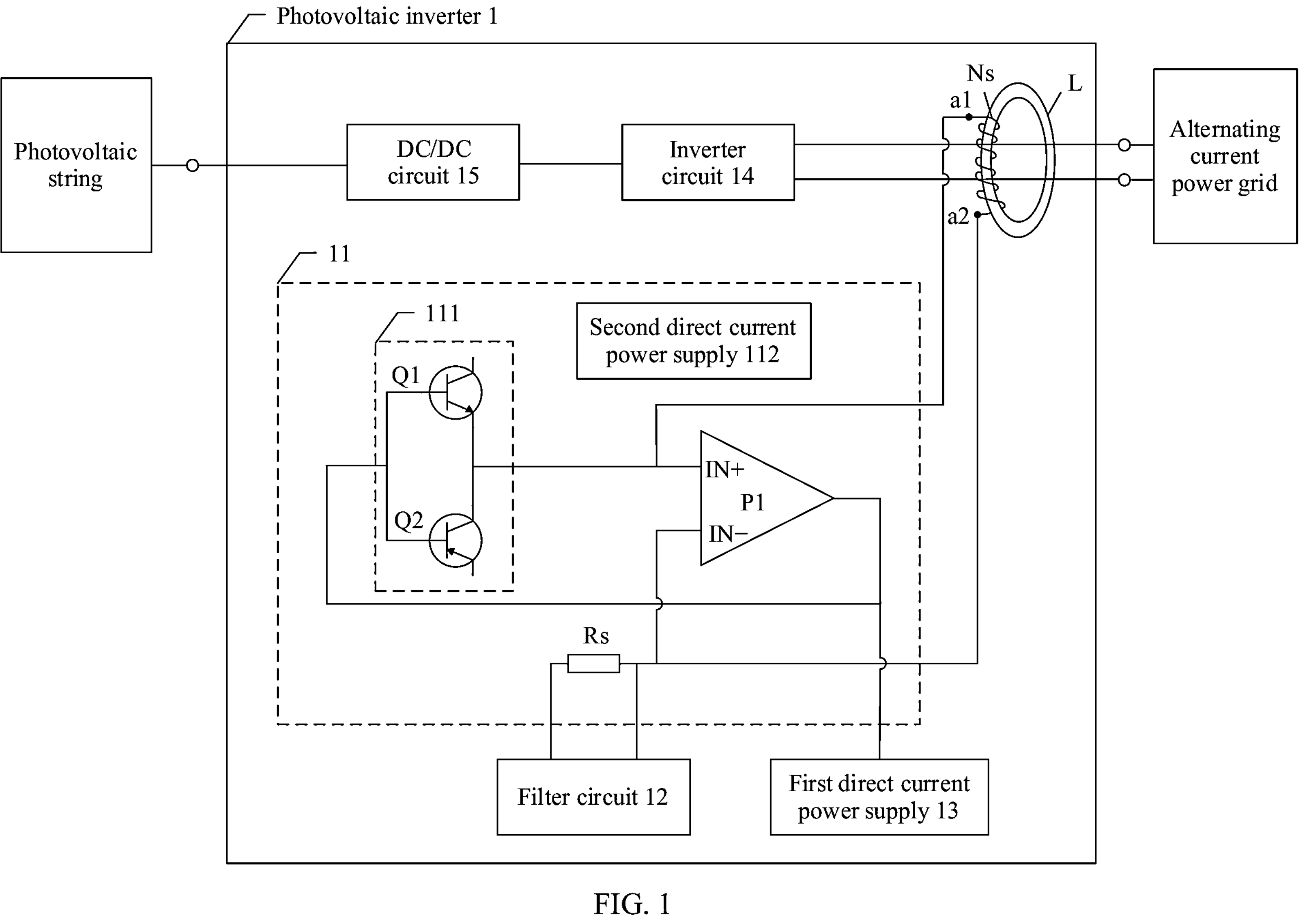
FIG. 1 is a schematic diagram of an application scenario of a photovoltaic inverter according to this application.

FIG. 1 is a schematic diagram of an application scenario of a photovoltaic inverter according to this application. In a photovoltaic power supply scenario, the photovoltaic inverter provided in this application may be the photovoltaic inverter 1 shown in FIG. 1. An input end and an output end of the photovoltaic inverter 1 are respectively connected to a photovoltaic string and an alternating current power grid. The photovoltaic inverter 1 includes a magnetic ring L, a leakage current detection winding Ns, a modulation wave circuit 11, a filter circuit 12, a first direct current power supply 13, an inverter circuit 14, and a direct current/direct current (DC/DC) circuit 15. An input end and an output end of the DC/DC circuit 15 are respectively connected to the input end of the photovoltaic inverter 1 and an input end of the inverter circuit 14. An output end of the inverter circuit 14 is connected to the output end of the photovoltaic inverter 1. A connection line between the output end of the inverter circuit 14 and the output end of the photovoltaic inverter 1 passes through the magnetic ring L. The leakage current detection winding Ns is wound on the magnetic ring L. The modulation wave circuit 11 includes a first push-pull circuit 111, a second direct current power supply 112, a comparator P1, and a leakage current sampling resistor Rs. The first push-pull circuit 111 includes a first switching transistor Q1 and a second switching transistor Q2. A series connection point of the first switching transistor Q1 and the second switching transistor Q2 is connected to a first end a1 of the leakage current detection winding Ns. A second end a2 of the leakage current detection winding Ns is connected to the leakage current sampling resistor Rs. A control end of the first switching transistor Q1 and a control end of the second switching transistor Q2 are connected to an output end of the comparator P1. A positive input terminal and a negative input terminal of the comparator P1 are respectively connected to the first end a1 and the second end a2 of the leakage current detection winding Ns. The output end of the comparator P1 is connected to an output end of the first direct current power supply 13. Input ends of the filter circuit 12 are respectively connected to two ends of the leakage current sampling resistor Rs.

After the photovoltaic inverter 1 starts running, the photovoltaic inverter 1 may control the DC/DC circuit 15 to perform direct current conversion on a direct current generated by the photovoltaic string and output a converted direct current to the input end of the inverter circuit 14, to control the inverter circuit 14 to invert, to an alternating current, the direct current that is input from the input end of the inverter circuit 14 and that is obtained after direct current conversion, thereby supplying power to the alternating current power grid.

At the same time, in a process in which the photovoltaic inverter 1 supplies power to the alternating current power grid, the first switching transistor Q1 is in an on state when the comparator P1 outputs a first level signal, to control the first direct current power supply 13 so that the leakage current detection winding Ns is in a first charging state. The second switching transistor Q2 is in an on state when the comparator P1 outputs a second level signal, to control the second direct current power supply 112 so that the leakage current detection winding Ns is in a second charging state. A current direction of the leakage current detection winding Ns in the first charging state is opposite to a current direction of the leakage current detection winding Ns in the second charging state. When the leakage current detection winding Ns is in a charging saturation status, a level signal output by the comparator P1 is inverted, so that the comparator P1 outputs a carrier signal. The carrier signal includes the first level signal and the second level signal that are alternating. The filter circuit 12 filters a voltage signal at the two ends of the leakage current sampling resistor Rs based on the carrier signal, to obtain a leakage voltage signal. Then, the photovoltaic inverter 1 obtains a leakage current value of the photovoltaic inverter 1 based on the leakage voltage signal, and when the leakage current value is greater than a leakage current threshold, controls the photovoltaic inverter 1 to shut down, thereby ensuring safety of a worker.

It may be understood that in the photovoltaic inverter 1, the first switching transistor Q1 and the first direct current power supply 13 form a charging loop of the leakage current detection winding Ns in the first charging state, and the second switching transistor Q2 and the second direct current power supply 112 form a charging loop of the leakage current detection winding Ns in the second charging state. In addition, because a value of a load current that can pass through each switching transistor in the first push-pull circuit 111 is large, a current value of the leakage current detection winding Ns in a charging status increases. Therefore, duration required for the leakage current detection winding Ns to enter the charging saturation status is shortened, thereby improving detection precision of leakage current detection of the photovoltaic inverter 1. The foregoing provides an example of the application scenario of the photovoltaic inverter provided in this application. The example is not exhaustive. The application scenario is not limited in this application.

With reference to FIG. 2 to FIG. 8, the following describes working principles of a leakage current detection apparatus and a photovoltaic inverter provided in this application by using examples.

Figure 2:
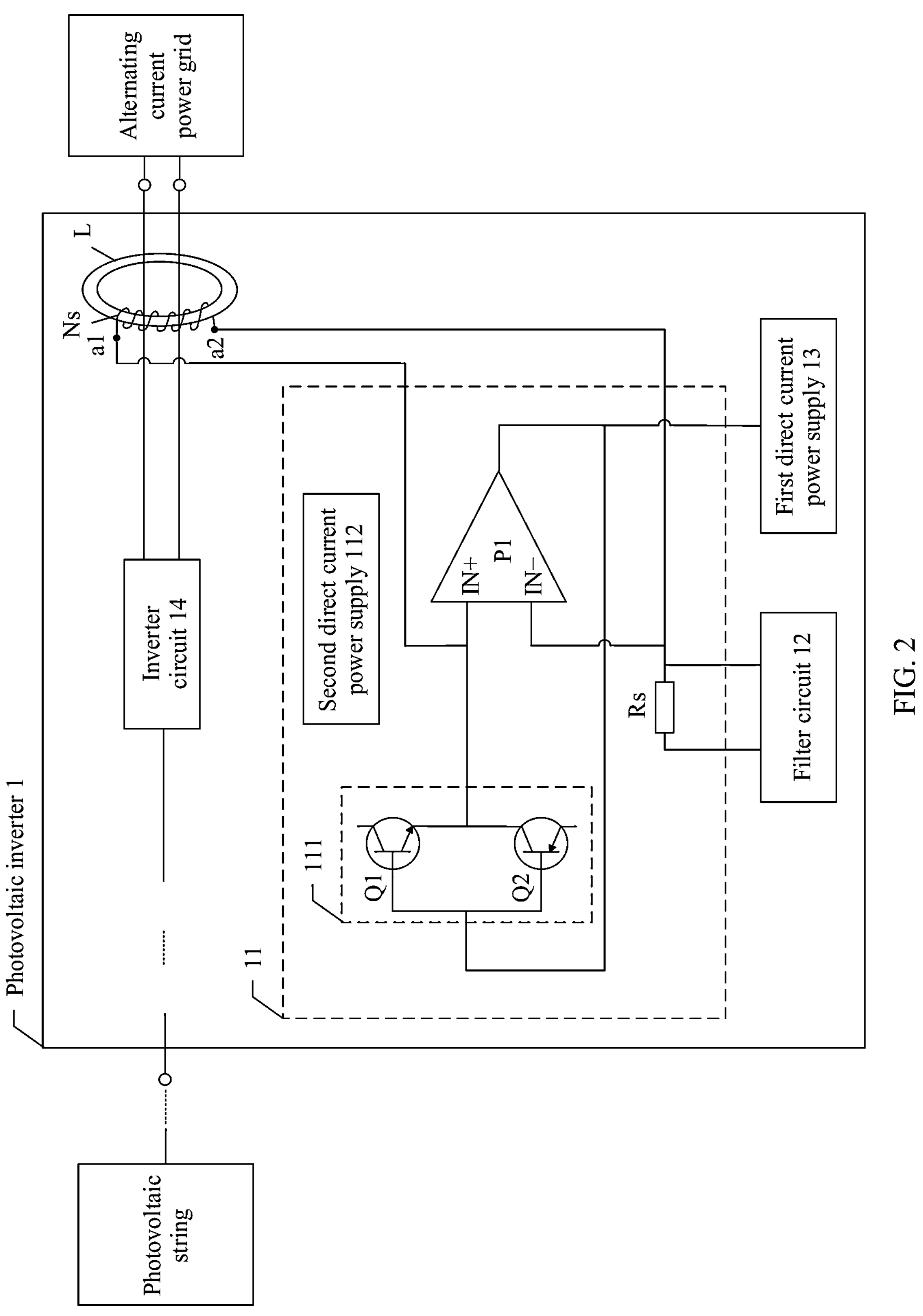
FIG. 2 is a schematic diagram of a structure of a photovoltaic inverter according to this application.

FIG. 2 is a schematic diagram of a structure of a photovoltaic inverter according to this application. As shown in FIG. 2, the photovoltaic inverter 1 includes a magnetic ring L, a leakage current detection winding Ns, a modulation wave circuit 11, a filter circuit 12, a first direct current power supply 13, and an inverter circuit 14. The leakage current detection winding Ns is wound on the magnetic ring L. A connection line between an output end of the inverter circuit 14 and an output end of the photovoltaic inverter 1 passes through the magnetic ring L. The modulation wave circuit 11 includes a first push-pull circuit 111, a comparator P1, a second direct current power supply 112, and a leakage current sampling resistor Rs. The first push-pull circuit 111 includes a first switching transistor Q1 and a second switching transistor Q2. A series connection point of the first switching transistor Q1 and the second switching transistor Q2 is connected to a first end a1 of the leakage current detection winding Ns. A second end a2 of the leakage current detection winding Ns is connected to the leakage current sampling resistor Rs. A control end of the first switching transistor Q1 and a control end of the second switching transistor Q2 are connected to an output end of the comparator P1. A positive input terminal and a negative input terminal of the comparator P1 are respectively connected to the first end a1 and the second end a2 of the leakage current detection winding Ns. The output end of the comparator P1 is connected to an output end of the first direct current power supply 13. Input ends of the filter circuit 12 are respectively connected to two ends of the leakage current sampling resistor Rs.

It should be noted that an input end of the inverter circuit 14 may be directly connected to an input end of the photovoltaic inverter 1. In this case, a DC/DC converter is further connected between the input end of the photovoltaic inverter 1 and a photovoltaic string. The DC/DC converter is configured to: perform direct current conversion on a direct current output by the photovoltaic string, and implement maximum power point tracking (MPPT) of the photovoltaic string, thereby ensuring highly efficient power generation of the photovoltaic string. Optionally, the photovoltaic inverter 1 further includes a DC/DC circuit. An input end of the inverter circuit 14 may be connected to an input end of the photovoltaic inverter 1 through the DC/DC circuit. In this case, the input end of the photovoltaic inverter 1 may be directly connected to a photovoltaic string. A function of the DC/DC circuit herein is the same as a function of the foregoing DC/DC converter. Details are not described herein again. The photovoltaic inverter 1 has various structures and high flexibility.

In a process in which the photovoltaic inverter 1 supplies power to an alternating current power grid, the first switching transistor Q1 is in an on state when the comparator P1 outputs a first level signal, to control the first direct current power supply 13 so that the leakage current detection winding Ns is in a first charging state. The second switching transistor Q2 is in an on state when the comparator P1 outputs a second level signal, to control the second direct current power supply 112 so that the leakage current detection winding Ns is in a second charging state. A current direction of the leakage current detection winding Ns in the first charging state is opposite to a current direction of the leakage current detection winding Ns in the second charging state. When the leakage current detection winding Ns is in a charging saturation status, a level signal output by the comparator P1 is inverted, so that the comparator P1 outputs a carrier signal. The carrier signal includes the first level signal and the second level signal that are alternating. The filter circuit 12 filters a voltage signal at the two ends of the leakage current sampling resistor Rs based on the carrier signal, to obtain a leakage voltage signal.

In this embodiment of this application, in the photovoltaic inverter 1, the first switching transistor Q1 and the first direct current power supply 13 form a charging loop of the leakage current detection winding Ns in the first charging state, and the second switching transistor Q2 and the second direct current power supply 112 form a charging loop of the leakage current detection winding Ns in the second charging state. In addition, because a value of a load current that can pass through each switching transistor in the push-pull circuit is large, a current value of the leakage current detection winding Ns in a charging status increases. Therefore, duration required for the leakage current detection winding Ns to enter the charging saturation status is shortened, thereby improving detection precision of leakage current detection of the photovoltaic inverter 1.

Figure 3:
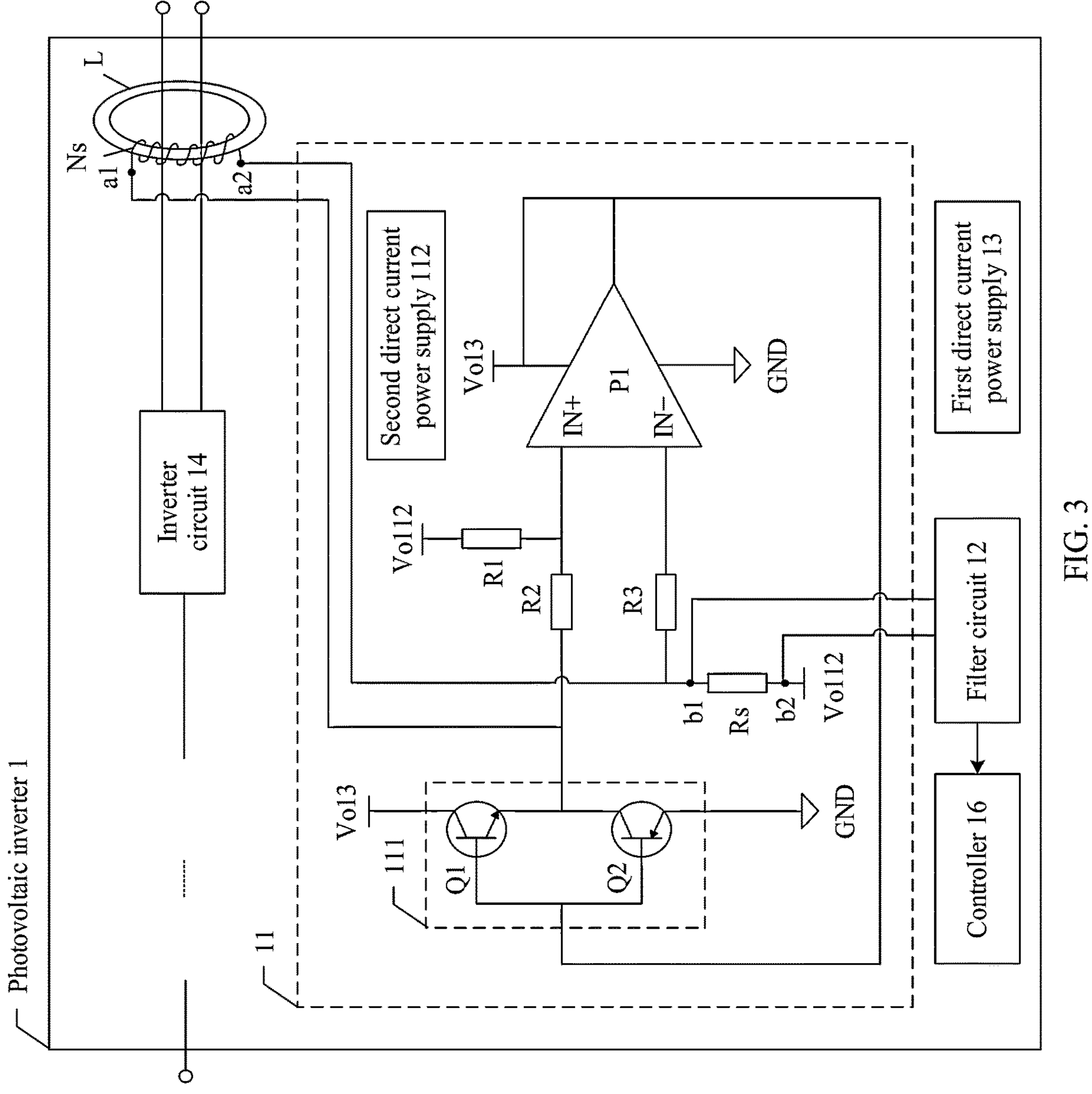
FIG. 3 is another schematic diagram of a structure of a photovoltaic inverter according to this application.

FIG. 3 is another schematic diagram of a structure of a photovoltaic inverter according to this application. As shown in FIG. 3, compared with the photovoltaic inverter 1 shown in FIG. 2, the photovoltaic inverter 1 shown in FIG. 3 has a different modulation wave circuit 11. Specifically, the modulation wave circuit 11 includes a first push-pull circuit 111, a comparator P1, a second direct current power supply 112, a leakage current sampling resistor Rs, a first resistor R1, a second resistor R2, and a third resistor R3. The first push-pull circuit 111 includes a first switching transistor Q1 and a second switching transistor Q2. A collector and an emitter of the first switching transistor Q1 are respectively connected to an output end Vo13 of the first direct current power supply 13 and a collector of the second switching transistor Q2. An emitter of the second switching transistor Q2 is connected to a reference ground GND. The emitter of the first switching transistor Q1 is connected to a first end a1 of a leakage current detection winding Ns. A second end a2 of the leakage current detection winding Ns is connected to one end b1 of the leakage current sampling resistor Rs. The other end b2 of the leakage current sampling resistor Rs is connected to an output end Vo112 of a second direct current power supply 112. A base of the first switching transistor Q1 and a base of the second switching transistor Q2 are connected to an output end of the comparator P1. A positive input terminal of the comparator P1 is connected to the output end Vo112 of the second direct current power supply 112 through the first resistor R1. The positive input terminal of the comparator P1 is connected to the first end a1 of the leakage current detection winding Ns through the second resistor R2. A negative input terminal of the comparator P1 is connected to the second end a2 of the leakage current detection winding Ns through the third resistor R3. The output end and a positive power supply end of the comparator P1 are connected to the output end Vo13 of the first direct current power supply 13. A negative power supply end of the comparator P1 is connected to the reference ground GND. Herein, for specific descriptions of another circuit in the photovoltaic inverter 1 other than the modulation wave circuit 11, refer to the descriptions of corresponding parts in the photovoltaic inverter 1 shown in FIG. 2. Details are not described herein again. Optionally, the photovoltaic inverter 1 further includes a controller 16.

It should be noted that, in this embodiment of this application, an example in which a structure of the first push-pull circuit 111 is an upper N-lower P structure, and the switching transistor in the first push-pull circuit 111 is a bipolar junction transistor (BJT) is used for description. Optionally, a structure of the first push-pull circuit 111 in this application may be alternatively an upper P-lower N structure. In addition, the switching transistor in the first push-pull circuit 111 in this application may be alternatively a metal-oxide-semiconductor field-effect transistor (MOSFET) other than a BJT. This is not limited in this application.

A magnetic ring L may be made of a cobalt-based amorphous material, a nanocrystalline alloy material, or a permalloy material. The cobalt-based amorphous material, the nanocrystalline alloy material, or the permalloy material has a relatively high saturation magnetic flux and initial magnetic permeability, to ensure that a relatively small leakage current causes a change of a magnetic flux in a magnetic circuit, thereby helping improve detection sensitivity of a leakage current sensor that is formed by the magnetic ring L and the leakage current detection winding Ns. In addition, the cobalt-based amorphous material, the permalloy material, or the nanocrystalline alloy material has relatively small coercivity and a relatively high magnetic moment. When the leakage current sensor works at a relatively high frequency, the leakage current detection winding Ns can reach a magnetic saturation state based on a relatively small excitation current, thereby helping reduce power consumption and simplify a circuit design.

In a process in which the photovoltaic inverter 1 supplies power to an alternating current power grid, the comparator P1 outputs a first level signal (in other words, a high level signal) when the first direct current power supply 13 starts to output a voltage VCC to the output end of the comparator P1. In this case, the first switching transistor Q1 is turned on. Because of a voltage difference between the output voltage VCC of the first direct current power supply 13 and an output voltage VREF of the second direct current power supply 112, a current flows out from the output end Vo13 of the first direct current power supply 13, sequentially passes through the first switching transistor Q1, the leakage current detection winding Ns, and the leakage current sampling resistor Rs, and then flows to the output end Vo112 of the second direct current power supply 112, to control the first direct current power supply 13 so that the leakage current detection winding Ns enters a first charging state (in other words, a forward charging state). The first direct current power supply 13 herein is a direct current power supply on which the first direct current power supply 13 and the second direct current power supply 112 act together. The first direct current power supply 13 and the second direct current power supply 112 output currents in opposite directions and respectively output the voltage VCC and the voltage VREF. When the leakage current detection winding Ns is in a forward saturation state, impedance of the leakage current detection winding Ns is close to 0. The first end and the second end of the leakage current detection winding Ns are equivalent to a short-circuit state. In this case, both a voltage at the first end and a voltage at the second end of the leakage current detection winding Ns are the output voltage VCC of the first direct current power supply 13. In addition, a voltage at the positive input terminal of the comparator P1 is a voltage division value obtained after VCC and VREF pass through the first resistor R1 and the second resistor R2, and is less than a value of a voltage at the second end (in other words, VCC) of the leakage current detection winding Ns, so that a level signal output by the comparator P1 is inverted, and a second level signal (in other words, a low level signal) is output.

After the comparator P1 outputs the second level signal, the first switching transistor Q1 changes from the on state to an off state, and the second switching transistor Q2 is turned on. In this case, the first end a1 of the leakage current detection winding Ns is connected to the reference ground GND. Because of a voltage difference between the output voltage VREF of the second direct current power supply 112 and the reference ground GND, a current flows out from the output end Vo112 of the second direct current power supply 112, sequentially passes through the leakage current sampling resistor Rs, the leakage current detection winding Ns, and the second switching transistor Q2, and flows into the reference ground GND, to control the second direct current power supply 112 so that the leakage current detection winding Ns enters the second charging state (in other words, a reverse charging state). Specifically, under effect of the voltage difference between VREF and the reference ground GND, the leakage current detection winding Ns is desaturated from the forward saturation state and then quickly enters the reverse charging state. A current direction of the leakage current detection winding Ns in the forward charging state (in other words, from the first end a1 to the second end a2 of the leakage current detection winding Ns) is opposite to a current direction of the leakage current detection winding Ns in the reverse charging state (in other words, from the second end a2 of the leakage current detection winding Ns to the first end a1). When the leakage current detection winding Ns is in a reverse saturation state, impedance of the leakage current detection winding Ns is close to 0. The first end and the second end of the leakage current detection winding Ns are equivalent to a short-circuit state. In this case, both a voltage at the first end and a voltage at the second end of the leakage current detection winding Ns are a voltage of the reference ground GND. In this case, a voltage at the positive input terminal of the comparator P1 is a division value obtained after VREF and the voltage of the reference ground GND pass through the first resistor R1 and the second resistor R2, and is greater than a value of a voltage at the second end (in other words, the voltage of the reference ground GND) of the leakage current detection winding Ns, so that a level signal output by the comparator P1 is inverted, and a first level signal is output. Based on such cycle, the comparator P1 outputs a carrier signal whose positive and negative amplitudes are the first level signal and the second level signal. The first level signal is specifically the output voltage VCC of the first direct current power supply 13, the second level signal is specifically 0, and the carrier signal is a pulse-width modulation (PWM) wave signal. A frequency of the carrier signal is $f=V_{OH}/(4n*B_s*A_c)$, where $V_{OH}$ is a maximum level at both ends of a magnetic core, n is a quantity of coil turns, $B_s$ is a saturation magnetic flux density, and $A_c$ is a cross-sectional area of the magnetic core. In actual application, the frequency of the carrier signal is usually 11 kHz.

Then, both the carrier signal and a leakage current signal detected by the leakage current detection winding Ns act on the leakage current sampling resistor Rs. To collect actual leakage current information, the carrier signal (in other words, a high-frequency signal) is filtered out by using a filter circuit 12, and integrity of the leakage current information is ensured. Therefore, the filter circuit 12 in this application uses a low-pass filter of a two-stage filter structure. It may need to be ensured that there is large enough attenuation at the frequency of the carrier signal, and gains of 0 kHz to 2 kHz also may need to be consistent, to ensure precision of a 0 kHz to 2 KHz frequency band when software uses only a direct current component for correction. Specifically, a cut-off frequency $f_0$ of the filter circuit 12 is designed to be 2.5 kHz, and a high-frequency signal (including a high-frequency voltage signal corresponding to an 11 kHz carrier signal) whose frequency is greater than 2.5 kHz is filtered out, so that a leakage voltage signal corresponding to a leakage current signal at 2.5 kHz or below 2.5 kHz passes through. A design process of the filter circuit 12 is as follows: A transfer function of a second operational amplifier U1 included in the filter circuit 12 is U1i*(R4+R5)/(2*R4)=U1o, and a transfer function of a third operational amplifier U2 is U2i/(1/R6+1/jωC2)=U2o. Then, the cut-off frequency of the filter circuit 12 can be obtained based on transfer function curves of the foregoing two operational amplifiers in a Bode plot.

Figure 4A:
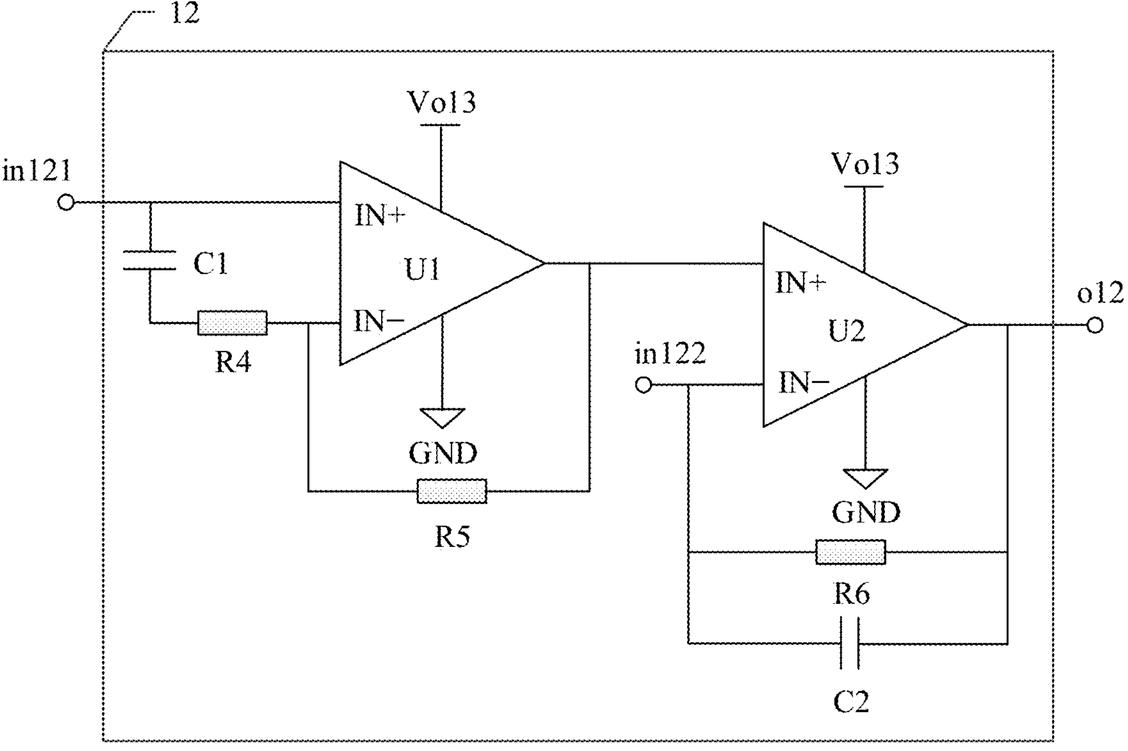
FIG. 4A is a schematic diagram of a structure of a filter circuit according to this application.

FIG. 4A is a schematic diagram of a structure of a filter circuit 12 according to this application. As shown in FIG. 4A, the filter circuit 12 includes a second operational amplifier U1, a third operational amplifier U2, a ninth resistor R4, a tenth resistor R5, an eleventh resistor R6, a first capacitor C1, and a second capacitor C2. The ninth resistor R4 and the first capacitor C1 are connected in series between a positive input terminal and a negative input terminal of the second operational amplifier U1. The tenth resistor R5 is connected between the negative input terminal and an output end of the second operational amplifier U1. A positive input terminal of the third operational amplifier U2 is connected to the output end of the second operational amplifier U1. The eleventh resistor R6 and the second capacitor C2 are connected in parallel between a negative input terminal and an output end of the third operational amplifier U2. The positive input terminal of the second operational amplifier U1 and the negative input terminal of the third operational amplifier U2 are respectively connected to a first input end in121 and a second input end in122 of the filter circuit 12. The output end of the third operational amplifier U2 is connected to an output end of the filter circuit 12. The first input end in121 and the second input end in122 of the filter circuit 12 are respectively connected to one end b1 and the other end b2 of the leakage current sampling resistor Rs. A positive power supply end and a negative power supply end of the second operational amplifier U1 are respectively connected to the output end Vo13 of the first direct current power supply 13 and the reference ground GND. A positive power supply end and a negative power supply end of the third operational amplifier U2 are respectively connected to the output end Vo13 of the first direct current power supply 13 and the reference ground GND.

When performing filtering, the filter circuit 12 further amplifies a signal. Specifically, the filter circuit 12 further has a signal amplification function by using the second operational amplifier U1 and the third operational amplifier U2. A signal amplification coefficient of the second operational amplifier U1 is A1=|U1o|/|U1i|. A signal amplification coefficient of the third operational amplifier U2 is A2=|U2o|/|U2i|.

Because the voltage signal at the two ends of the leakage current sampling resistor Rs include a bias of the direct current voltage VREF output by the second direct current power supply 112, when the filter circuit 12 is designed, the same bias of the direct current voltage VREF is also introduced to the second input end in122 of the filter circuit 12, thereby eliminating the bias of the direct current voltage VREF, filtering out a high-frequency voltage signal, restoring a low-frequency voltage signal below 2 kHz without distortion, and obtaining a leakage voltage signal.

Figure 4B:
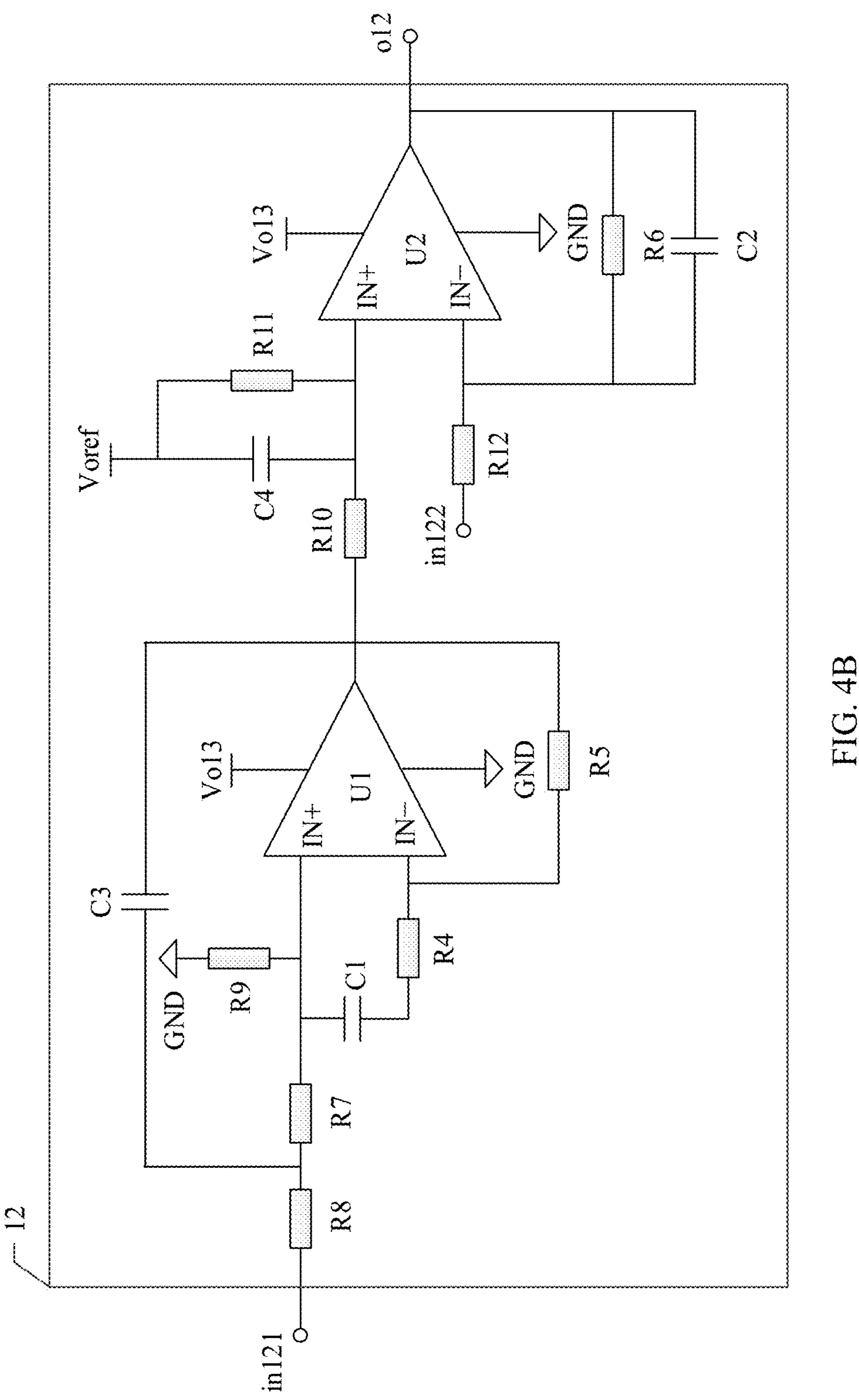
FIG. 4B is another schematic diagram of a structure of a filter circuit according to this application.

Optionally, the filter circuit 12 shown in FIG. 4A may further include a twelfth resistor R7, a thirteenth resistor R8, a fourteenth resistor R9, a fifteenth resistor R10, a sixteenth resistor R11, a seventeenth resistor R12, a third capacitor C3, and a fourth capacitor C4. For details, refer to a filter circuit 12 shown in FIG. 4B. As shown in FIG. 4B, the positive input terminal of the second operational amplifier U1 is connected to the first input end in121 of the filter circuit 12 sequentially through the twelfth resistor R7 and the thirteenth resistor R8. A connection point between the twelfth resistor R7 and the thirteenth resistor R8 is connected to the output end of the second operational amplifier U1 through the third capacitor C3. The positive input terminal of the second operational amplifier U1 is connected to the reference ground GND through the fourteenth resistor R9. The positive input terminal of the third operational amplifier U2 is connected to the output end of the second operational amplifier U1 through the fifteenth resistor R10. The sixteenth resistor R11 and the fourth capacitor are connected in parallel between the positive input terminal of the third operational amplifier and a reference voltage end Voerf. The negative input terminal of the third operational amplifier U2 is connected to the second input end in 122 of the filter circuit 12 through the seventeenth resistor R12. A voltage value of the reference voltage end Voerf may be 1.5 V. In actual application, the voltage value of the reference voltage end Voerf may be correspondingly adjusted based on an application scenario and according to an actual requirement. This is not limited in this application.

Herein, a transfer function of the second operational amplifier in the filter circuit 12 shown in FIG. 4B is $$U1i/((R8+R7+Z1+R8*(R7+Z1)/j\omega C3)*R4/(Z1*(R4+R5))-R8/j\omega C3)=U1o,$$

where Z1=1/(1/R9+1/jωC1). A transfer function of the third operational amplifier is U2i*Z2*(R12+Z3)/((R10+Z2)*R12)=U2o, where Z2=1/(1/R11+1/jωC4) and Z3=1/(1/R6+1/jωC2).

It should be noted that the filter circuit 12 in the foregoing embodiment is described by using an example in which the cut-off frequency is 2.5 kHz. In a process of designing the filter circuit 12, an RC parameter in the filter circuit 12 may be changed according to an actual requirement, to adjust the cut-off frequency of the filter circuit 12, so that the cut-off frequency of the filter circuit 12 can be further less than 2.5 kHz.

Then, the controller 16 obtains the leakage voltage signal, performs AD sampling on the leakage voltage signal, and obtains a leakage current value of the photovoltaic inverter 1 through calculation.

Figure 5A:
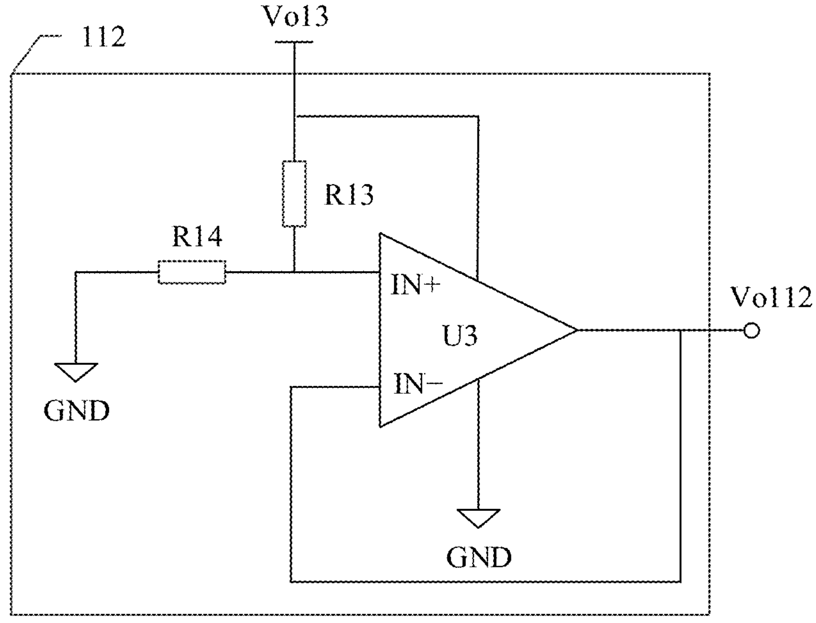
FIG. 5A is a schematic diagram of a structure of a second direct current power supply according to this application.

In addition, the second direct current power supply 112 in this application may be a second direct current power supply 112 shown in FIG. 5A. As shown in FIG. 5A, the second direct current power supply 112 includes a first operational amplifier U3, a seventh resistor R13, and an eighth resistor R14. A positive input terminal of the first operational amplifier U3 is connected to the output end Vo13 of the first direct current power supply 13 through the seventh resistor R13. The positive input terminal of the first operational amplifier U3 is connected to the reference ground GND through the eighth resistor R14. An output end of the first operational amplifier U3 is connected to a negative input terminal of the first operational amplifier U3 and the output end Vo112 of the second direct current power supply 112. A positive power supply end and a negative power supply end of the first operational amplifier U3 are respectively connected to the output end Vo13 of the first direct current power supply 13 and the reference ground GND.

The second direct current power supply 112 herein is a voltage follower. An output voltage of the second direct current power supply 112 is a voltage division value obtained after an output voltage VCC of the first direct current power supply 13 passes through the seventh resistor R13 and the eighth resistor R14. In this application, resistance values of the seventh resistor R13 and the eighth resistor R14 may be set, so that the output voltage of the second direct current power supply 112 is greater than or equal to half of the output voltage of the first direct current power supply 13. In actual application, the resistance value of the seventh resistor R13 is usually set to be equal to the resistance value of the eighth resistor R14, so that the output voltage of the second direct current power supply 112 is half of the output voltage of the first direct current power supply 13, and positive and negative offset ranges of the carrier signal are symmetric.

It may be understood that the second direct current power supply 112 uses a voltage follower structure in this embodiment. A circuit is simple and easy to control, thereby improving stability of the photovoltaic inverter 1 and improving detection precision and accuracy of leakage current detection of the photovoltaic inverter 1.

Figure 5B:
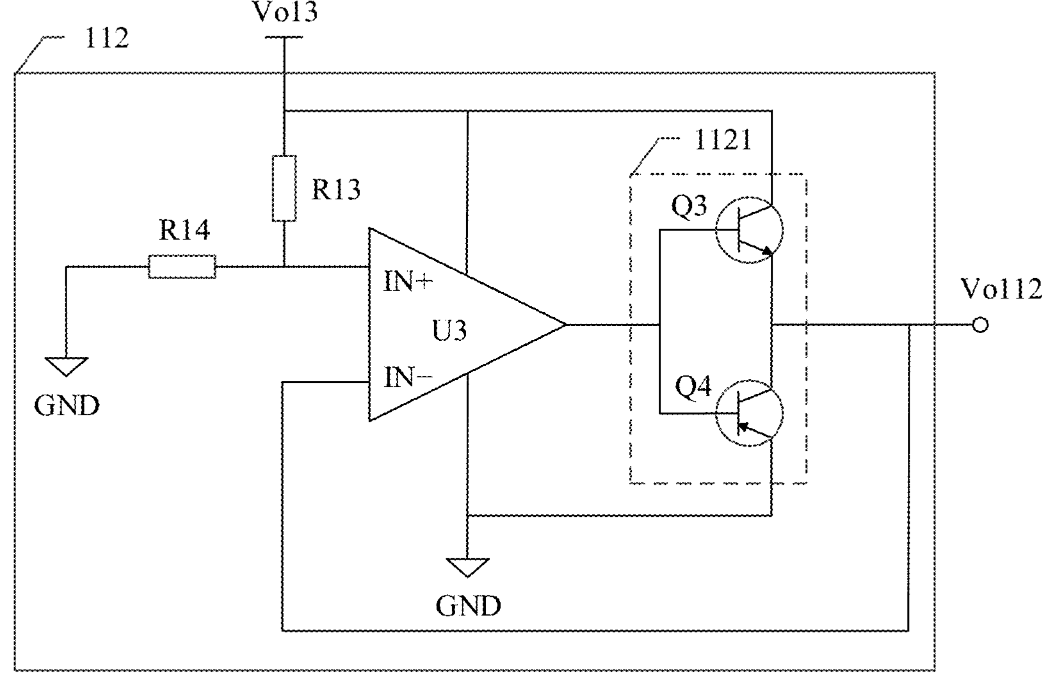
FIG. 5B is another schematic diagram of a structure of a second direct current power supply according to this application.

Optionally, the second direct current power supply 112 may be alternatively a second direct current power supply 112 shown in FIG. 5B. As shown in FIG. 5B, compared with the second direct current power supply 112 shown in FIG. 5A, the second direct current power supply 112 shown in FIG. 5B has an additional second push-pull circuit 1121. Specifically, the second direct current power supply 112 includes a seventh resistor R13, an eighth resistor R14, a first operational amplifier U3, and a second push-pull circuit 1121. The second push-pull circuit 1121 includes a third switching transistor Q3 and a fourth switching transistor Q4. A positive input terminal of the first operational amplifier U3 is connected to the output end Vo13 of the first direct current power supply 13 through the seventh resistor R13. The positive input terminal of the first operational amplifier U3 is connected to the reference ground GND through the eighth resistor R14. A negative input terminal of the first operational amplifier U3 is connected to an emitter of the third switching transistor Q3 and an output end Vol12 of the second direct current power supply 112. An output end of the first operational amplifier U3 is connected to a base of the third switching transistor Q3 and a base of the fourth switching transistor Q4. The collector and an emitter of the third switching transistor Q3 are respectively connected to the output end Vo13 of the first direct current power supply 13 and a collector of the fourth switching transistor Q4. An emitter of the fourth switching transistor Q4 is connected to the reference ground GND. A positive power supply end and a negative power supply end of the first operational amplifier U3 are respectively connected to the output end Vo13 of the first direct current power supply 13 and the reference ground GND. Optionally, the second direct current power supply 112 shown in FIG. 5B may further include an eighteenth resistor and a nineteenth resistor. The eighteenth resistor is connected between the output end of the first operational amplifier U3 and the base of the third switching transistor Q3. The nineteenth resistor is connected between the emitter of the third switching transistor Q3 and the output end Vo112 of the second direct current power supply 112.

After the first direct current power supply 13 supplies power to the second direct current power supply 112, the first operational amplifier U3 starts to output the voltage. When the output voltage of the first operational amplifier U3 is within a preset voltage range, both the third switching transistor Q3 and the fourth switching transistor Q4 are in a linear state. In this case, the third switching transistor Q3 and the fourth switching transistor Q4 perform series voltage division on the output voltage VCC of the first direct current power supply 13. Therefore, the output voltage of the second direct current power supply 112 is half of the output voltage VCC of the first direct current power supply 13. It may be understood that, when a load connected to the second direct current power supply 112 changes, the second push-pull circuit 1121 may adjust impedance of the second push-pull circuit 1121 based on the change of the load, so that a current output by the second push-pull circuit 1121 meets a load requirement, thereby improving stability of the second direct current power supply 112.

In this application, resistance values of the seventh resistor R13 and the eighth resistor R14 may be set, so that the output voltage of the second direct current power supply 112 is greater than or equal to half of the output voltage of the first direct current power supply 13. In actual application, the resistance value of the seventh resistor R13 is usually set to be equal to the resistance value of the eighth resistor R14, so that the output voltage of the second direct current power supply 112 is half of the output voltage of the first direct current power supply 13, and positive and negative offset ranges of the carrier signal are symmetric.

It may be understood that the second push-pull circuit is added to the second direct current power supply 112 based on the voltage follower in this embodiment, so that the output voltage of the second direct current power supply 112 is more stable, thereby improving detection precision and accuracy of leakage current detection of the photovoltaic inverter 1.

In this embodiment of this application, in the photovoltaic inverter 1, the first switching transistor Q1 and the first direct current power supply 13 form the charging loop of the leakage current detection winding Ns in the first charging state, and the second switching transistor Q2 and the second direct current power supply 112 form the charging loop of the leakage current detection winding Ns in the second charging state. In addition, because the value of the load current that can pass through each switching transistor in the push-pull circuit is large, the current value of the leakage current detection winding Ns in the charging status increases. Therefore, duration required for the leakage current detection winding Ns to enter the charging saturation status is shortened, thereby improving detection precision of leakage current detection of the photovoltaic inverter 1.

Figure 6:
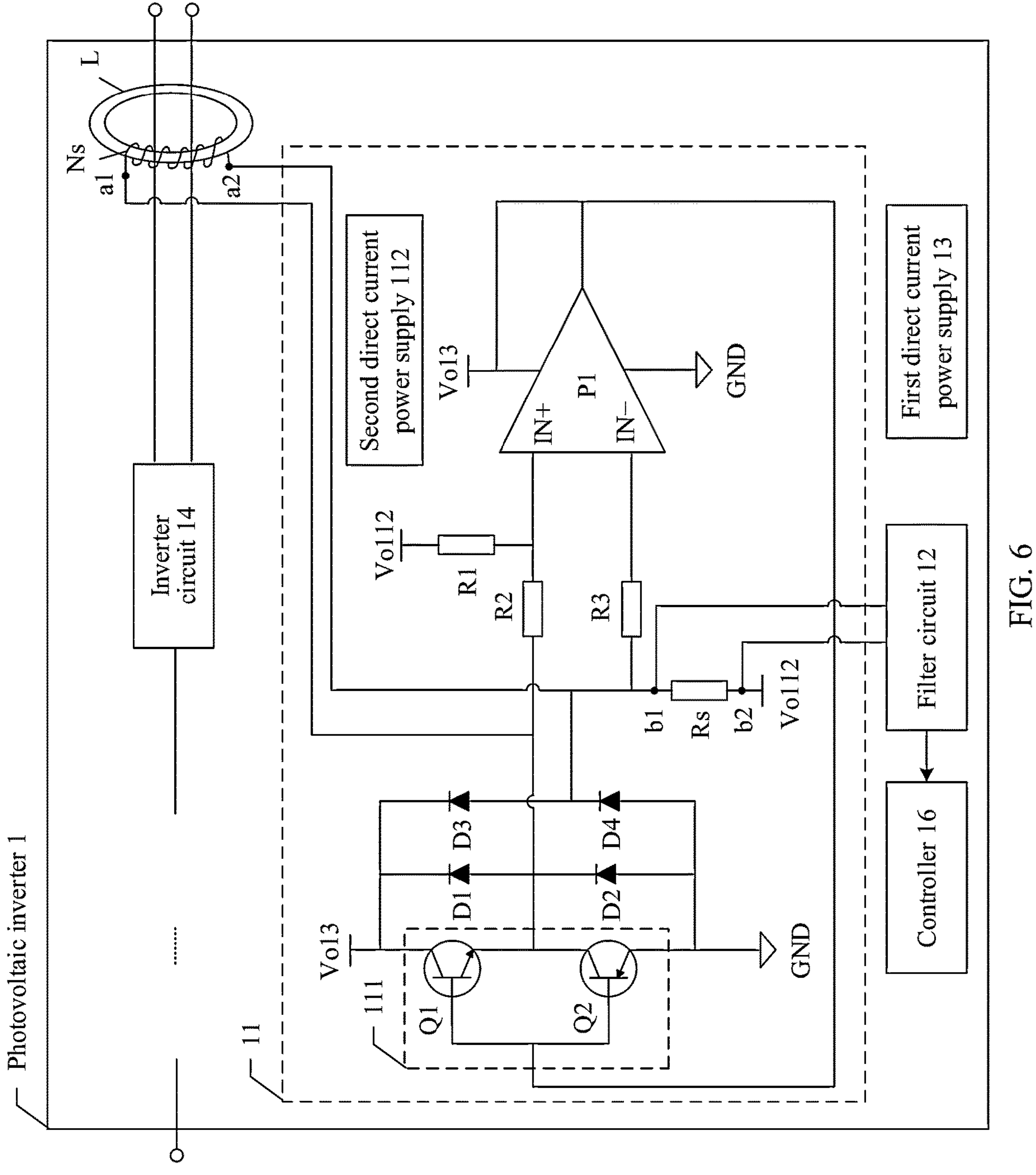
FIG. 6 is another schematic diagram of a structure of a photovoltaic inverter according to this application.

FIG. 6 is another schematic diagram of a structure of a photovoltaic inverter according to this application. As shown in FIG. 6, compared with the photovoltaic inverter 1 shown in FIG. 3, the photovoltaic inverter 1 shown in FIG. 6 has a different structure of a modulation wave circuit 11. Specifically, compared with the modulation wave circuit 11 shown in FIG. 3, the modulation wave circuit 11 shown in FIG. 6 additionally has a first diode D1, a second diode D2, a third diode D3, and a fourth diode D4. A cathode of the first diode D1 and a cathode of the third diode D3 are connected to an output end Vo13 of a first direct current power supply 13. An anode of the first diode D1 is connected to a cathode of the second diode D2 and a first end a1 of a leakage current detection winding Ns. An anode of the third diode D3 is connected to a cathode of the fourth diode D4 and a second end a2 of the leakage current detection winding Ns. An anode of the second diode D2 and an anode of the fourth diode D4 are connected to a reference ground GND. Herein, working principles of the photovoltaic inverter 1 shown in FIG. 6 are consistent with working principles of the photovoltaic inverter 1 shown in FIG. 3. Details are not described herein again.

In this embodiment of this application, in the photovoltaic inverter 1, a first switching transistor Q1 and the first direct current power supply 13 form a charging loop of the leakage current detection winding Ns in a first charging state, and a second switching transistor Q2 and a second direct current power supply 112 form a charging loop of the leakage current detection winding Ns in a second charging state. In addition, because a value of a load current that can pass through each switching transistor in a push-pull circuit is large, a current value of the leakage current detection winding Ns in a charging status increases. Therefore, duration required for the leakage current detection winding Ns to enter a charging saturation status is shortened, thereby improving detection precision of leakage current detection of the photovoltaic inverter 1. In addition, the four diodes, from the first diode D1 to the fourth diode D4, are added to the modulation wave circuit 11, so that not only voltages at two ends of the leakage current detection winding Ns can be clamped, but also each switching transistor in the first push-pull circuit 111 can be protected. Therefore, stability of the modulation wave circuit 11 during working is improved, thereby improving stability of the photovoltaic inverter 1 during working.

Figure 7:
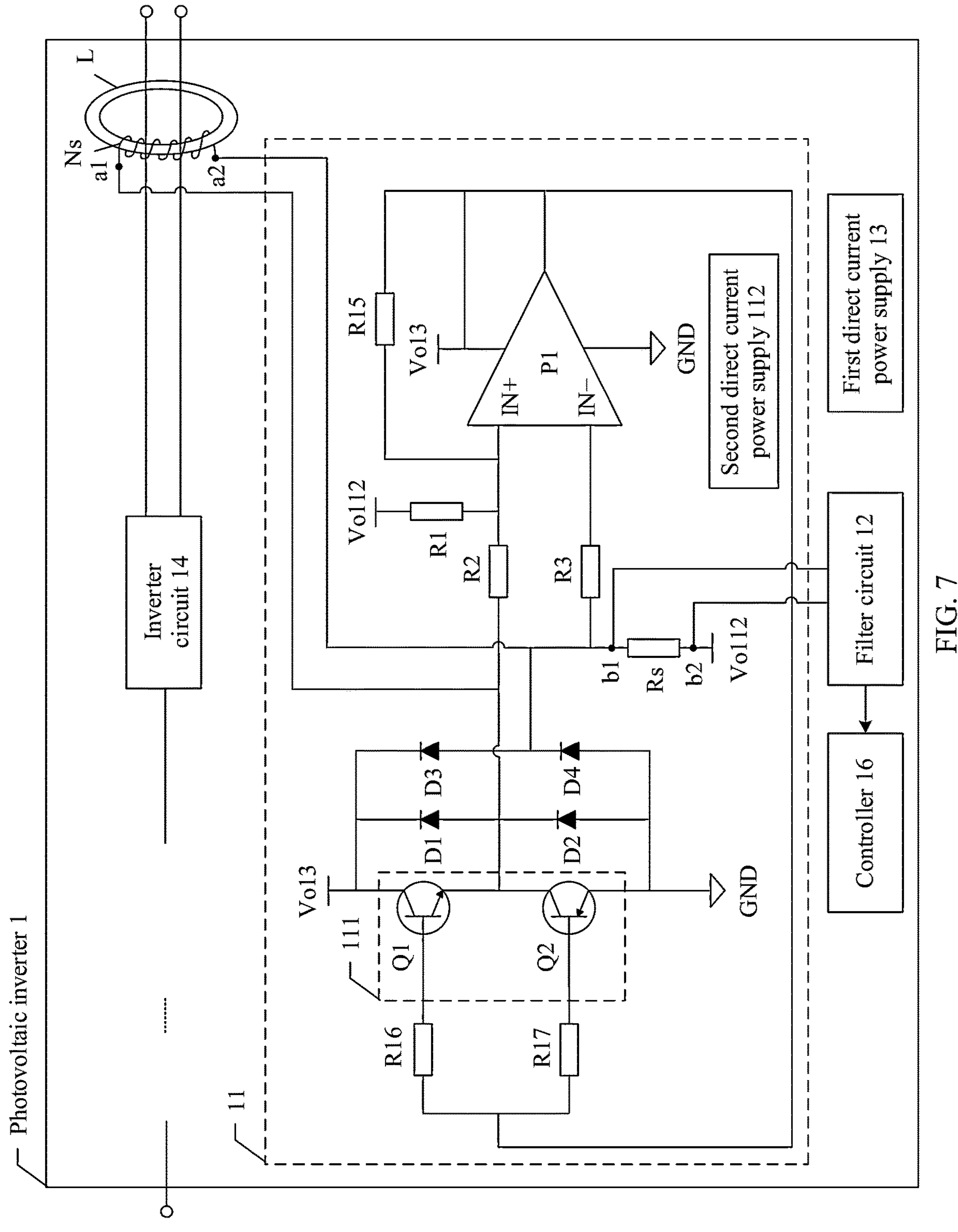
FIG. 7 is still another schematic diagram of a structure of a photovoltaic inverter according to this application.

FIG. 7 is still another schematic diagram of a structure of a photovoltaic inverter according to this application. As shown in FIG. 7, compared with the photovoltaic inverter 1 shown in FIG. 6, the photovoltaic inverter 1 shown in FIG. 7 has a different structure of a modulation wave circuit 11. Specifically, compared with the modulation wave circuit 11 shown in FIG. 6, the modulation wave circuit 11 shown in FIG. 7 additionally has a fourth resistor R15, a fifth resistor R16, and a sixth resistor R17. The fourth resistor R15 is connected between a positive input terminal and an output end of a comparator P1, so that the fourth resistor R15 and the comparator P1 form a hysteresis comparator P1. An output end of the comparator P1 is connected to a base of a first switching transistor Q1 through the fifth resistor R16. The output end of the comparator P1 is connected to a base of a second switching transistor Q2 through the sixth resistor R17. Herein, working principles of the photovoltaic inverter 1 shown in FIG. 7 are consistent with working principles of the photovoltaic inverter 1 shown in FIG. 6. Details are not described herein again.

In this embodiment of this application, in the photovoltaic inverter 1, the first switching transistor Q1 and a first direct current power supply 13 form a charging loop of a leakage current detection winding Ns in a first charging state, and the second switching transistor Q2 and a second direct current power supply 112 form a charging loop of the leakage current detection winding Ns in a second charging state. In addition, because a value of a load current that can pass through each switching transistor in a push-pull circuit is large, a current value of the leakage current detection winding Ns in a charging status increases. Therefore, duration required for the leakage current detection winding Ns to enter a charging saturation status is shortened, thereby improving detection precision of leakage current detection of the photovoltaic inverter 1. In addition, the fourth resistor R15 is added to the modulation wave circuit 11 to form the hysteresis comparator P1, to avoid a case in which a frequency of a carrier signal is abnormal because of a plurality of times of output inversion when a voltage at the positive input terminal of the comparator P1 is close to a voltage at a negative input terminal. Therefore, stability of the carrier signal output by the comparator P1 is improved, thereby improving detection precision and accuracy of leakage current detection of the photovoltaic inverter 1. In addition, base resistors of the switching transistors in a first push-pull circuit 111, to be specific, the fifth resistor R16 and the sixth resistor R17, are added to the modulation wave circuit 11, to limit base currents of the switching transistors and protect the switching transistors. Therefore, stability of the modulation wave circuit 11 during working is improved, thereby improving detection precision and accuracy of leakage current detection of the photovoltaic inverter 1 and improving applicability.

Figure 8:
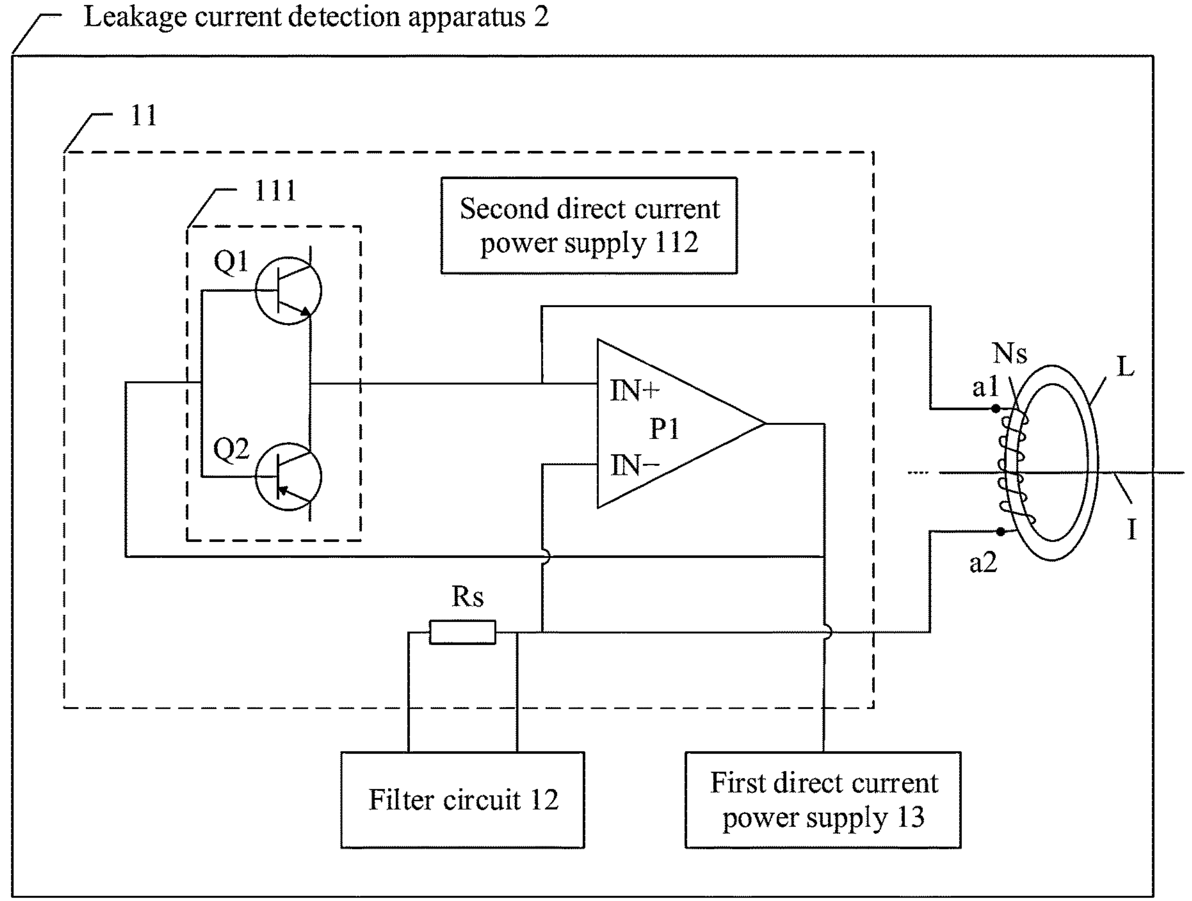
FIG. 8 is a schematic diagram of a structure of a leakage current detection apparatus according to this application.

FIG. 8 is a schematic diagram of a structure of a leakage current detection apparatus according to this application. As shown in FIG. 8, the leakage current detection apparatus 2 includes a magnetic ring L, a leakage current detection winding Ns, a modulation wave circuit 11, a filter circuit 12, and a first direct current power supply 13. The leakage current detection winding Ns is wound on the magnetic ring L. An output end connection line 1 of a to-be-detected device passes through the magnetic ring L. The modulation wave circuit 11 includes a first push-pull circuit 111, a comparator P1, a second direct current power supply 112, and a leakage current sampling resistor Rs. The first push-pull circuit 111 includes a first switching transistor Q1 and a second switching transistor Q2. A series connection point of the first switching transistor Q1 and the second switching transistor Q2 is connected to a first end of the leakage current detection winding Ns. A second end of the leakage current detection winding Ns is connected to the leakage current sampling resistor Rs. A control end of the first switching transistor Q1 and a control end of the second switching transistor Q2 are connected to an output end of the comparator P1. A positive input terminal and a negative input terminal of the comparator P1 are respectively connected to the first end and the second end of the leakage current detection winding Ns. The output end of the comparator P1 is connected to an output end of the first direct current power supply 13. Input ends of the filter circuit 12 are respectively connected to two ends of the leakage current sampling resistor Rs.

In a detection process of the leakage current detection apparatus 2, the first switching transistor Q1 is in an on state when the comparator P1 outputs a first level signal, to control the first direct current power supply 13 so that the leakage current detection winding Ns is in a first charging state. The second switching transistor Q2 is in an on state when the comparator P1 outputs a second level signal, to control the second direct current power supply 112 so that the leakage current detection winding Ns is in a second charging state. A current direction of the leakage current detection winding Ns in the first charging state is opposite to a current direction of the leakage current detection winding Ns in the second charging state. When the leakage current detection winding Ns is in a charging saturation status, a level signal output by the comparator P1 is inverted, so that the comparator P1outputs a carrier signal. The carrier signal includes the first level signal and the second level signal that are alternating. The filter circuit 12 filters a voltage signal at the two ends of the leakage current sampling resistor Rs based on the carrier signal, to obtain a leakage voltage signal.

It should be noted that the leakage current detection apparatus 2 may be located inside the to-be-detected device, in other words, the leakage current detection apparatus 2 is a part of the to-be-detected device. For the photovoltaic inverter 1 shown in FIG. 2 to FIG. 7, the leakage current detection apparatus 2 is a part of the photovoltaic inverter 1. Optionally, the leakage current detection apparatus 2 may further include a controller 16. When the leakage current detection apparatus 2 is located inside the to-be-detected device, the controller 16 in the leakage current detection apparatus 2 and a controller in the to-be-detected device may be the same controller, or may be two different controllers. The leakage current detection apparatus 2 may be alternatively located outside the to-be-detected device, and is a detection apparatus independent of the to-be-detected device.

In addition, the leakage current detection apparatus 2 shown in FIG. 8 is an embodiment of a simplest circuit structure provided in this application. Alternatively, the leakage current detection apparatus 2 provided in this application may be a detection apparatus that includes the magnetic ring L, the leakage current detection winding Ns, the modulation wave circuit 11, the filter circuit 12, and the first direct current power supply 13 in FIG. 3, FIG. 6, or FIG. 7. For working principles of the detection apparatus, refer to the corresponding descriptions of the photovoltaic inverter 1 shown in FIG. 3, FIG. 6, and FIG. 7. Details are not described herein again.

In this embodiment of this application, in the leakage current detection apparatus 2, the first switching transistor Q1 and the first direct current power supply 13 form a charging loop of the leakage current detection winding Ns in the first charging state, and the second switching transistor Q2 and the second direct current power supply 112 form a charging loop of the leakage current detection winding Ns in the second charging state. In addition, because a value of a load current that can pass through each switching transistor in the push-pull circuit is large, a current value of the leakage current detection winding Ns in a charging status increases. Therefore, duration required for the leakage current detection winding Ns to enter a charging saturation status is shortened, thereby improving detection precision of the leakage current detection apparatus 2.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A photovoltaic inverter comprising:
- a device output end configured to connect to an alternating current power grid;
- an inverter circuit comprising an inverter output end;
- a magnetic ring;
- a first direct current power supply comprising a first direct current (DC) output end;
- a leakage current detection winding wound on the magnetic ring and comprising a first winding end and a second winding end;
- a connection line connecting the inverter output end and the device output end and passing through the magnetic ring;
- a modulation wave circuit comprising:
  - a first push-pull circuit comprising:
    - a first switching transistor comprising a first control end; and
    - a second switching transistor comprising a second control end, wherein a series connection point of the first switching transistor and the second switching transistor is connected to the first winding end;
  - a second direct current power supply;
  - a leakage current sampling resistor comprising a first sampling resistor end and a second sampling resistor end, wherein the leakage current sampling resistor is coupled to the second winding end; and
  - a comparator configured to output an inverted level signal when the leakage current detection winding is in a charging saturation status, wherein the comparator comprises:
    - a positive input terminal coupled to the first winding end;
    - a negative input terminal coupled to the second winding end; and
    - a comparator output end coupled to the first control end, the second control end, and the first DC output end,
- wherein the first DC output end is configured to output a carrier signal, wherein the carrier signal comprises a first level signal and a second level signal that are alternating; and
- a filter circuit comprising input filter ends respectively connected to the first sampling resistor end and the second sampling resistor end, wherein the filter circuit is configured to filter a voltage signal at the first sampling resistor end and the second sampling resistor end based on the carrier signal in order to obtain a leakage voltage signal, wherein the first switching transistor is configured to be in an on-state when the comparator outputs the first level signal in order to control the first direct current power supply so that the leakage current detection winding is in a first charging state, wherein the second switching transistor is configured to be in an on-state when the comparator outputs the second level signal in order to control the second direct current power supply so that the leakage current detection winding is in a second charging state, and wherein a first current direction of the leakage current detection winding in the first charging state is opposite to a second current direction of the leakage current detection winding in the second charging state.

2. The photovoltaic inverter according to claim 1, wherein the second switching transistor further comprises:

a first transistor end; and a second transistor end configured to connect to a reference ground, and wherein the first switching transistor further comprises:

a third transistor end connected to the first DC output end; and a fourth transistor end connected to the first transistor end.

3. The photovoltaic inverter according to claim 1, wherein the second direct current power supply comprises a second DC output end, wherein the modulation wave circuit further comprises:

a first resistor connected between the positive input terminal and the second DC output end;

a second resistor connected between the positive input terminal and the first winding end; and a third resistor connected between the negative input terminal and a connection of the second winding end and the first sampling resistor end, and wherein the second sampling resistor end is connected to the second DC output end.

4. The photovoltaic inverter according to claim 3, wherein the modulation wave circuit further comprises:

a first diode comprising a first cathode and a first anode;

a second diode comprising a second cathode and a second anode;

a third diode comprising a third cathode and a third anode; and a fourth diode comprising a fourth cathode and a fourth anode, wherein the first cathode and the third cathode are connected to the first DC output end, wherein the first anode is connected to the second cathode and the first winding end, wherein the third anode is connected to the fourth cathode and the second winding end, and wherein the second anode and the fourth anode are connected to a reference ground.

5. The photovoltaic inverter according to claim 4, wherein the modulation wave circuit further comprises a fourth resistor connected between the positive input terminal and the comparator output end.

6. The photovoltaic inverter according to claim 5, wherein the modulation wave circuit further comprises:

a fifth resistor connected between the comparator output end and the first control end; and a sixth resistor connected between the comparator output end and the second control end.

7. The photovoltaic inverter according to claim 1, wherein the second direct current power supply comprises:

a second DC output end;

a first operational amplifier comprising a first operational amplifier (op-amp) positive input terminal, a first op-amp negative input terminal, and a first op-amp output end, wherein the first op-amp output end is connected to the first op-amp negative input terminal and connected to the second DC output end;

a seventh resistor connected between the first op-amp positive input terminal and the first DC output end; and an eighth resistor connected between the first op-amp positive input terminal and a reference ground.

8. The photovoltaic inverter according to claim 1, wherein the second direct current power supply comprises:

a second DC output end;

a first operational amplifier comprising a first operational amplifier (op-amp) positive input terminal, a first op-amp negative input terminal, and a first op-amp output end;

a seventh resistor connected between the first op-amp positive input terminal and the first DC output end;

an eighth resistor connected between the first op-amp positive input terminal and a reference ground; and a second push-pull circuit comprising:

a third switching transistor comprising a third control end connected to the first op- amp output end, wherein the third switching transistor is configured to be in a linear state when an output voltage of the first operational amplifier is within a preset voltage range; and a fourth switching transistor comprising a fourth control end connected to the first op-amp output end, wherein the fourth switching transistor is configured to be in a linear state when the output voltage of the first operational amplifier is within the preset voltage range, wherein a series connection point of the third switching transistor and the fourth switching transistor is connected to the first op-amp negative input terminal and the second DC output end, and wherein the linear state is a transition state between an off-state and an on-state of a switching transistor.

9. The photovoltaic inverter according to claim 8, wherein the third switching transistor further comprises:

a fifth transistor end connected to the first DC output end; and a sixth transistor end, wherein the fourth switching transistor further comprises:

a seventh transistor end connected to the sixth transistor end; and an eighth transistor end connected to the reference ground.

10. The photovoltaic inverter according to claim 7, wherein the first direct current power supply is configured to output a first output voltage, wherein the second direct current power supply is configured to output a second output voltage, and wherein the second output voltage is greater than or equal to half of the first output voltage.

11. The photovoltaic inverter according to claim 1, wherein the input filter ends comprise a first input filter end and a second input filter end, and wherein the filter circuit further comprises:

a filter output end;

a second operational amplifier (op-amp) comprising:

a second op-amp positive input terminal connected to the first input filter end;

a second op-amp negative input terminal; and a second op-amp output end;

a third operational amplifier comprising:

a third op-amp positive input terminal connected to the second op-amp output end;

a third op-amp negative input terminal connected to the second input filter end; and a third op-amp output end connected to the filter output end;

a ninth resistor;

a tenth resistor connected between the second op-amp negative input terminal and the second op-amp output end;

an eleventh resistor;

a first capacitor, wherein the first capacitor and the ninth resistor are connected in series between the second op-amp positive input terminal and the second op-amp negative input terminal; and a second capacitor, wherein the second capacitor and the eleventh resistor are connected in parallel between the third op-amp negative input terminal and the third op-amp output end.

12. The photovoltaic inverter according to claim 11, wherein the filter circuit is configured to filter out, in the voltage signal, a high-frequency signal whose frequency is greater than a cut-off frequency, and wherein the cut-off frequency is less than or equal to 2.5 kilohertz (kHz).

13. A leakage current detection apparatus, comprising:

a magnetic ring;

a leakage current detection winding wound on the magnetic ring and comprising a first winding end and a second winding end;

a first direct current power supply comprising a first direct current (DC) output end;

a modulation wave circuit comprising:

a first push-pull circuit comprising:

a first switching transistor comprising a first control end; and a second switching transistor comprising a second control end, wherein a series connection point of the first switching transistor and the second switching transistor is connected to the first winding end;

a second direct current power supply;

a leakage current sampling resistor comprising a first sampling resistor end and a second sampling resistor end, wherein the leakage current sampling resistor is connected to the second winding end; and a comparator comprising:

a positive input terminal coupled to the first winding end;

a negative input terminal coupled to the second winding end; and a comparator output end connected to the first control end, the second control end, and the first DC output end, wherein the first DC output end is configured to output a carrier signal, wherein the carrier signal comprises a first level signal and a second level signal that are alternating, and wherein when the leakage current detection winding is in a charging saturation status, a level signal output by the comparator is inverted; and a filter circuit comprising input filter ends respectively connected to the first sampling resistor end and the second sampling resistor end, wherein the filter circuit is configured to filter a voltage signal at the first sampling resistor end and the second resistor sampling end based on the carrier signal in order to obtain a leakage voltage signal, wherein the first switching transistor is configured to be in an on-state when the comparator outputs the first level signal in order to control the first direct current power supply so that the leakage current detection winding is in a first charging state, wherein the second switching transistor is configured to be in an on-state when the comparator outputs the second level signal in order to control the second direct current power supply so that the leakage current detection winding is in a second charging state, and wherein a first current direction of the leakage current detection winding in the first charging state is opposite to a second current direction of the leakage current detection winding in the second charging state.

14. The leakage current detection apparatus according to claim 13, wherein the second switching transistor further comprises:

a first transistor end; and a second transistor end is configured to connect to a reference ground, and wherein the first switching transistor comprises:

a third transistor end connected to the first DC output end; and a fourth transistor end connected to the first transistor end.

15. The leakage current detection apparatus according to claim 13, wherein the second direct current power supply comprises a second DC output end, wherein the modulation wave circuit further comprises:

a first resistor connected between the positive input terminal and the second DC output end;

a second resistor connected between the positive input terminal and the first winding end; and a third resistor connected between the negative input terminal and a connection of the second winding end and the first sampling resistor end, and wherein the second sampling resistor end is connected to the second DC output end.

16. The leakage current detection apparatus according to claim 15, wherein the modulation wave circuit further comprises:

a first diode comprising a first cathode and a first anode;

a second diode comprising a second cathode and a second anode;

a third diode comprising a third cathode and a third anode; and a fourth diode comprising a fourth cathode and a fourth anode, wherein the first cathode and the third cathode are connected to the first DC output end, wherein the first anode is connected to the second cathode and the first winding end, wherein the third anode is connected to the fourth cathode and the second winding end, and wherein the second anode and the fourth anode are connected to a reference ground.

17. The leakage current detection apparatus according to claim 13, wherein the modulation wave circuit further comprises a fourth resistor connected between the positive input terminal and the comparator output end.

18. The leakage current detection apparatus according to claim 17, wherein the modulation wave circuit further comprises:

a fifth resistor connected between the comparator output end and the first control end; and a sixth resistor connected between the comparator output end and the second control end.

19. The leakage current detection apparatus according to claim 13, wherein the second direct current power supply comprises:

a second DC output end;

a first operational amplifier (op-amp) comprising a first op-amp positive input terminal, a first op-amp negative input terminal, and a first op-amp output end, wherein the first op-amp output end is connected to the first op-amp negative input terminal and connected to the second DC output end;

a seventh resistor connected between the first op-amp positive input terminal and the first DC output end; and an eighth resistor connected between the first op-amp positive input terminal and a reference ground.

20. The leakage current detection apparatus according to claim 13, wherein the second direct current power supply comprises:

a second DC output end;

a first operational amplifier comprising (op-amp) a first op-amp positive input terminal, a first op-amp negative input terminal, and a first op-amp output end;

a seventh resistor connected between the first op-amp positive input terminal and the first DC output end;

an eighth resistor connected between the first op-amp positive input terminal and a reference ground; and a second push-pull circuit comprising:

a third switching transistor comprising a third control end connected to the first op-amp output end, wherein the third switching transistor is configured to be in a linear state when an output voltage of the first operational amplifier is within a preset voltage range; and a fourth switching transistor comprising a fourth control end connected to the first op-amp output end, wherein the fourth switching transistor is configured to be in a linear state when the output voltage of the first operational amplifier is within the preset voltage range, wherein a series connection point of the third switching transistor and the fourth switching transistor is connected to the first op-amp negative input terminal and the second DC output end, and wherein the linear state is a transition state between an off-state and an on-state of a switching transistor.

* * * * *